(12) United States Patent
Kumai

(10) Patent No.: US 10,859,744 B2
(45) Date of Patent: Dec. 8, 2020

(54) METHOD OF MANUFACTURING WIRE GRID POLARIZATION ELEMENT

(71) Applicant: SEIKO EPSON CORPORATION, Tokyo (JP)

(72) Inventor: Yoshitomo Kumai, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 38 days.

(21) Appl. No.: 16/229,137

(22) Filed: Dec. 21, 2018

(65) Prior Publication Data

US 2019/0196079 A1 Jun. 27, 2019

(30) Foreign Application Priority Data

Dec. 25, 2017 (JP) ................................ 2017-247346
Apr. 30, 2018 (JP) ................................ 2018-087917

(51) Int. Cl.
*G02F 1/1335* (2006.01)
*G02B 5/30* (2006.01)
*H01L 21/311* (2006.01)

(52) U.S. Cl.
CPC ..... *G02B 5/3058* (2013.01); *G02F 1/133528* (2013.01); *G02F 2001/133548* (2013.01); *H01L 21/31144* (2013.01)

(58) Field of Classification Search
CPC ............. G02B 5/3058; G02F 1/133528; G02F 2001/133548; H01L 451/675; H01L 2229/016; H01L 21/31138; H01L 21/31144

USPC ...... 216/13, 18, 19, 20, 67, 41, 72; 438/717, 438/725, 736

See application file for complete search history.

(56) References Cited

U.S. PATENT DOCUMENTS

| 6,122,103 | A | 9/2000 | Perkins et al. | |
|---|---|---|---|---|
| 10,310,321 | B2* | 6/2019 | Hirata | G02B 5/3058 |
| 2005/0088739 | A1* | 4/2005 | Chiu | G02B 5/3058 |
| | | | | 359/485.05 |
| 2009/0039056 | A1* | 2/2009 | Kamijima | G03F 7/00 |
| | | | | 216/38 |
| 2012/0105745 | A1 | 5/2012 | Kumai | |
| 2013/0128358 | A1 | 5/2013 | Hanashima | |
| 2013/0323928 | A1* | 12/2013 | Tanaka | G03F 1/24 |
| | | | | 438/694 |

(Continued)

FOREIGN PATENT DOCUMENTS

| JP | 2003-502708 A | 1/2003 |
|---|---|---|
| JP | 2007-310250 A | 11/2007 |

(Continued)

*Primary Examiner* — Lan Vinh
(74) *Attorney, Agent, or Firm* — Oliff PLC

(57) ABSTRACT

In a manufacturing process of a wire grid polarization element, a metal film, a light absorption film, and an inorganic material film for hard mask are sequentially formed, and then a resist mask is formed using nanoimprinting. Next, the metal film is patterned into a plurality of wire-shaped metal layers by dry etching. The resist mask is remaining at the bottom portion of the concave portion interposed between the adjacent convex portions. $\Delta t/P$ (%), which is obtained by dividing, by the pitch P (nm), the difference $\Delta t$ (nm) between the maximum value and the minimum value of the thickness t (nm) of the residual film of the resist mask remaining at the bottom portion of the concave portion, is rendered to be 13.4% or less.

18 Claims, 19 Drawing Sheets

(56) References Cited

U.S. PATENT DOCUMENTS

| | | | |
|---|---|---|---|
| 2014/0313571 A1* | 10/2014 | Gardner | G02B 5/3058 |
| | | | 359/352 |
| 2015/0234230 A1 | 8/2015 | Hirata et al. | |
| 2016/0231621 A1 | 8/2016 | Kim | |
| 2017/0153372 A1* | 6/2017 | Yang | C23C 14/042 |

FOREIGN PATENT DOCUMENTS

| | | | |
|---|---|---|---|
| JP | 2012-098469 A | 5/2012 | |
| JP | 2013-149884 A | 8/2013 | |
| JP | 2015-180975 A | 10/2015 | |
| JP | 2016-096275 A | 5/2016 | |
| WO | 2013/190681 A1 | 12/2013 | |

* cited by examiner

METHOD OF MANUFACTURING WIRE GRID POLARIZATION ELEMENT

BACKGROUND

1. Technical Field

The invention relates to a method of manufacturing a wire grid polarization element equipped with a wire grid which includes a plurality of wire-shaped metal layers extending in parallel to each other.

2. Related Art

A projection-type display apparatus includes a liquid crystal panel, a light source unit configured to emit light to be supplied to the liquid crystal panel, and a projection optical system configured to project light modulated by a light valve. A polarization element is arranged on an optical path extending from the light source unit, via the liquid crystal panel, to the projection optical system. Although for such a polarization element, a polarization element made of an organic material is frequently used, a polarization element made of an organic material has low heat resistance. Under such a circumstance, there is proposed a use of a wire grid polarization element (inorganic polarization element) in which a metallic wire grid made of aluminum, an aluminum alloy, or the like is formed on a translucent substrate.

A method of manufacturing a wire grid polarization element is proposed, in which a metal film is formed on a substrate, a resist mask is formed by direct e-beam lithography, and then the metal film is patterned by reactive ion etching (RIE) (see JP-T-2003-502708). JP-T-2003-502708 also discloses that the polarization properties vary depending on the width of a wire-shaped metal layer with respect to the pitch of the wire-shaped metal layers.

There is also proposed, as a method of manufacturing a wire grid polarization element, a nanoimprinting method in which a metal film is formed on a substrate, and then asperities of a mold material are transferred to a photo-curable resist having been coated, to form a resist mask. According to the above-described method, the resist mask can be formed in more efficient manner than the technology disclosed in JP-T-2003-502708. Further, JP-A-2013-149884 discloses a method of transferring asperities to a resist by performing a transfer step in an environment for suppressing volatilization of the components contained in the resist and then reducing the thickness of the resist mask (thickness of the residual film) remaining at the bottom portion of a concave portion interposed between adjacent convex portions.

The inventor of the disclosure has investigated a method in which a wire-shaped metal layer is formed in a state of a mother substrate that is larger than a substrate of wire grid polarization element and then the mother substrate is divided to produce a plurality of wire grid polarization elements, where in the course of the investigation, it is found that the thickness of the residual film varies depending on the position on the mother substrate, due to a variation in the transfer pressure and the like. In a case where such a variation occurs, the amount of dry etching is set in accordance with the thickest residual film. As a result, the wire grid polarization element produced from the region where the residual film is thin, has problems of narrowing the width of the wire-shaped metal layer and deteriorating the optical properties. Unfortunately, according to the method described in JP-A-2013-149884, a particular environment is prepared for suppressing volatilization of the components contained in the resist at a significant cost, yet making it difficult to eliminate the variation in the thickness of the residual film.

SUMMARY

In view of the above, an advantage of some aspects of the disclosure is to provide a method of manufacturing a wire grid polarization element and a substrate for manufacturing a wire grid polarization element, by which a plurality of wire grid polarization elements having adequate polarization properties can be produced from a mother substrate even when the thickness of the residual film varies depending on the position on the mother substrate.

To achieve the above-described advantage, one aspect of the disclosure is a method of manufacturing a wire grid polarization element including a wire grid configured as a plurality of wire-shaped metal layers arranged in parallel to each other at an equal pitch on one surface of a substrate, the method including, film-forming a metal film and an inorganic material film for hard mask sequentially on one surface of a mother substrate that is larger than the substrate, forming a resist mask after the film-forming, where a resist layer is coated on one side of the mother substrate, then a mold material for nanoimprinting is pressed against the resist layer to form, to the resist layer, a plurality of convex portions arranged in parallel to each other at a pitch equivalent to a pitch of the plurality of wire-shaped metal layers, and thereafter the resist layer is cured to form the resist mask, performing dry etching with the resist mask formed, and thus performing a patterning of the metal film to form the plurality of wire-shaped metal layers, and dividing the mother substrate into a plurality of wire grid polarization elements, wherein the forming a resist mask includes leaving the resist mask at a bottom portion of a concave portion interposed between adjacent convex portions of the plurality of convex portions, and Δt/P (%) is 13.4% or less, where a thickness of the resist mask remaining at the bottom portion of the concave portion is defined as t (nm), a difference between a maximum value and a minimum value of the thickness t is defined as Δt (nm), and the pitch is defined as P (nm).

In the disclosure, in forming a resist mask using a nanoimprinting method, the resist layers each of which constituting the convex portion are coupled to each other via the resist layer constituting the bottom portion of the concave portion to remain a resist mask at the bottom portion of the concave portion interposed between the convex portions transferred to the resist layer. This prevents the resist layer constituting the convex portion from being peeled off in releasing the mold material after the mold material has been pressed against the resist layer to transfer the convex portion to the resist layer. Here, the variation of the thickness of the resist mask (residual film) remaining at the bottom portion of the concave portion on the mother substrate causes the polarization properties of the plurality of wire grid polarization elements produced from an identical mother substrate to be varied. Therefore, in the disclosure, Δt/P (%) is controlled to be 13.4% or less, where the difference Δt (nm) between the maximum value and the minimum value of the thickness t (nm) of the resist mask remaining at the bottom portion of the concave portion is related to the pitch P. This suppress the variation in the polarization properties of the plurality of wire grid polarization elements produced from an identical mother substrate. This therefore enables a wire grid polarization element to be stably manufactured, in which a contrast ratio CR, which is a ratio between light transmittances of the wire grid polarization element with respect to two linearly polarized light beams having electric field vibration directions orthogonal to each other, is 100 or greater.

In the disclosure, an aspect may be employed in which Δt/P (%) is 9.7% or less. According to the above aspect, a wire grid polarization element can be stably manufactured, in which a contrast ratio CR, which is a ratio between light transmittances of the wire grid polarization element with respect to two linearly polarized light beams having electric field vibration directions orthogonal to each other, is 500 or greater.

Another aspect of the disclosure is a method of manufacturing a wire grid polarization element including a wire grid configured as a plurality of wire-shaped metal layers arranged in parallel to each other at an equal pitch on one surface of a substrate, the method including, film-forming a metal film and an inorganic material film for hard mask sequentially on one surface of a mother substrate that is larger than the substrate, forming a resist mask after the film-forming, where a resist layer is coated on one side of the mother substrate, then a mold material for nanoimprinting is pressed against the resist layer to form, in the resist layer, a plurality of convex portions arranged in parallel to each other at a pitch equivalent to a pitch of the plurality of wire-shaped metal layers, and thereafter the resist layer is cured to form the resist mask, performing dry etching with the resist mask formed, and thus performing a patterning of the metal film to form the plurality of wire-shaped metal layers, and dividing the mother substrate into a plurality of wire grid polarization elements, wherein the forming a resist mask includes leaving the resist mask at a bottom portion of a concave portion interposed between adjacent convex portions of the plurality of convex portions, and a pitch P (nm) and a difference Δt meet following conditional formula: Δt≤(0.14×P−0.3) where a thickness of the resist mask remaining at the bottom portion of the concave portion is defined as t (nm), a difference between a maximum value and a minimum value of the thickness t is defined as Δt (nm), and the pitch is defined as P (nm).

In the disclosure, in forming a resist mask using a nanoimprinting method, the resist layers each of which constituting the convex portion are coupled to each other via the resist layer constituting the bottom portion of the concave portion to remain a resist mask at the bottom portion of the concave portion interposed between the convex portions transferred to the resist layer. This prevents the resist layer constituting the convex portion from being peeled off in releasing the mold material after the mold material has been pressed against the resist layer to transfer the convex portion to the resist layer. Here, the variation of the thickness of the resist mask (residual film) remaining at the bottom portion of the concave portion on the mother substrate causes the polarization properties of the plurality of wire grid polarization elements obtained from an identical mother substrate to be varied. Therefore, in the disclosure, Δt is controlled to be (0.14×P−0.3) or less, where the difference Δt (nm) between the maximum value and the minimum value of the thickness t (nm) of the resist mask remaining at the bottom portion of the concave portion is related to the pitch P. This suppress the variation in the polarization properties of the plurality of wire grid polarization elements produced from an identical mother substrate. This therefore enables a wire grid polarization element to be stably manufactured, in which a contrast ratio CR, which is a ratio between light transmittances of the wire grid polarization element with respect to two linearly polarized light beams having electric field vibration directions orthogonal to each other, is 100 or greater.

In the disclosure, an aspect may be employed in which a pitch P (nm) and a difference Δt meet following conditional formula: Δt≤(0.11×P−1.4) According to the above aspect, a wire grid polarization element can be stably manufactured, in which a contrast ratio CR, which is a ratio between light transmittances of the wire grid polarization element with respect to two linearly polarized light beams having electric field vibration directions orthogonal to each other, is 500 or greater.

In the disclosure, an aspect may be employed in which in the film-forming, the metal film, a light absorption film, and the inorganic material film are sequentially formed. According to the above aspect, the light absorption film, remaining on the leading end portion of the wire-shaped metal layer on the opposite side to the substrate, suppresses light incident from one surface side of the substrate from being reflected by the wire-shaped metal layer.

Another aspect of the disclosure is a substrate for manufacturing a wire grid polarization element including a wire grid configured as a plurality of wire-shaped metal layers arranged in parallel to each other at an equal pitch on one surface of a substrate, wherein a metal film, an inorganic material film for hard mask, and a resist mask including a plurality of convex portions arranged in parallel at an equal pitch are sequentially provided on one side of a mother substrate, and in the resist mask, Δt/P (%) is 13.4% or less where a thickness of the resist mask remaining on a bottom portion of a concave portion interposed between adjacent convex portions of the plurality of convex portions is defined as t (nm), a difference between a maximum value and a minimum value of the thickness t is defined as Δt (nm), and the pitch of the convex portions is defined as P (nm).

Still another aspect of the disclosure is a substrate for manufacturing a wire grid polarization element including a wire grid configured as a plurality of wire-shaped metal layers arranged in parallel to each other at an equal pitch on one surface of a substrate, wherein a metal film, an inorganic material film for hard mask, and a resist mask including a plurality of convex portions arranged in parallel at an equal pitch are sequentially provided on one side of a mother substrate, and in the resist mask, a pitch P(nm) and a difference Δt meet the following conditional formula: Δt≤ (0.14×P−0.3) where a thickness of the resist mask remaining on a bottom portion of a concave portion interposed between adjacent convex portions of the plurality of convex portions is defined as t (nm), a difference between a maximum value and a minimum value of the thickness t is defined as Δt (nm), and the pitch of the convex portions is defined as P (nm).

In the disclosure, an aspect may be employed in which the difference Δt represents a difference between a maximum value and a minimum value obtained by measuring a thickness t of the resist mask remaining at the bottom portion of the concave portion at a plurality of points in an effective region on the mother substrate, from which the plurality of substrates are produced.

In the disclosure, an aspect may be employed in which the plurality of points include at least a center portion in the effective region and a first end portion of the effective region located apart from the center portion toward one side in a first direction.

In the disclosure, an aspect may be employed in which, provided that a direction orthogonal to the first direction is defined as a second direction, the plurality of points at least include, the center portion, the first end portion, a second end portion of the effective region located apart from the center portion toward the other side in the first direction, a third end portion of the effective region located apart from the center portion toward one side in the second direction, and a fourth end portion of the effective region located apart from the center portion toward the other side in the second direction.

In the disclosure, an aspect may be employed in which the plurality of points further include, a first intermediate position located between the center portion and the first end portion in a manner apart from the center portion and the first end portion by a distance of 1 cm or greater, a second intermediate position located between the center portion and the second end portion in a manner apart from the center portion and the second end portion by a distance of 1 cm or greater, a third intermediate position located between the center portion and the third end portion in a manner apart from the center portion and the third end portion by a distance of 1 cm or greater, and a fourth intermediate position located between the center portion and the fourth end portion in a manner apart from the center portion and the fourth end portion by a distance of 1 cm or greater.

In the disclosure, an aspect may be employed in which, provided that one of two directions intersecting the first direction and the second direction is defined as a third direction and the other is defined as a fourth direction, the plurality of points further include, a fifth end portion of the effective region located apart from the center portion toward one side in the third direction, a sixth end portion of the effective region located apart from the center portion toward the other side in the third direction, a seventh end portion of the effective region located apart from the center portion toward one side in the fourth direction, and an eighth end portion of the effective region located apart from the center portion toward the other side in the fourth direction.

In the disclosure, an aspect may be employed in which in the effective region, the thickness t of the resist mask is measured at each of a plurality of regions, as the plurality of points, from each of which each of the substrates is produced.

In the disclosure, an aspect may be employed in which a focused ion beam scanning electron microscope is used for measuring the thickness t of the resist mask.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
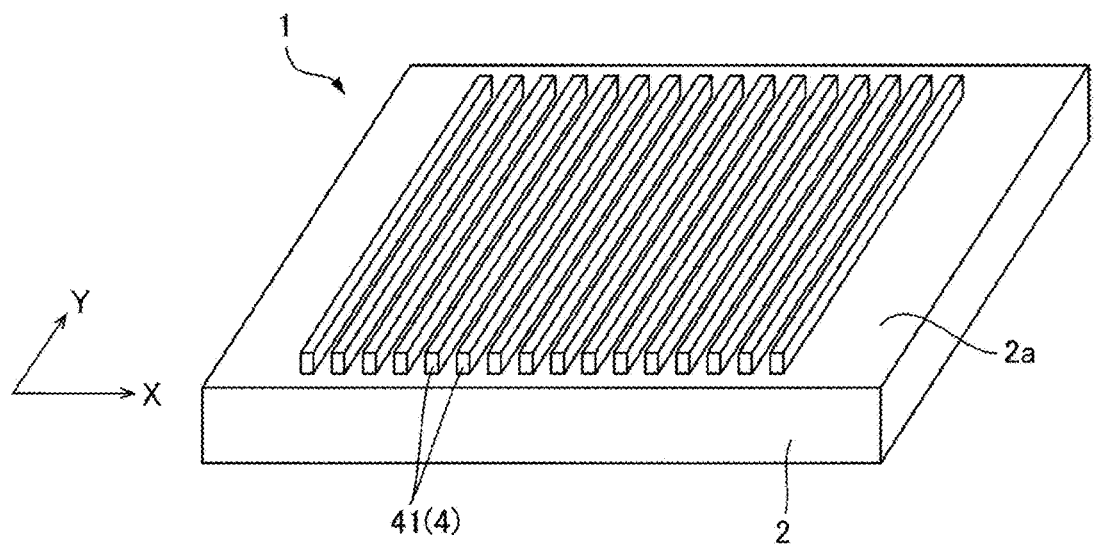
FIG. 1 is an explanatory view of a wire grid polarization element to which the disclosure is applied.

An exemplary embodiment of the invention is described below with reference to the accompanying drawings. Note that, in each of the drawings to be referenced in the descriptions below, to make layers, members, and the like recognizable in terms of size in the drawings, each of the layers, members, and the like are illustrated in different scales. Also note that, in the descriptions below, a direction in which a wire grid 4 (wire-shaped metal layers 41) extends is referred to as direction Y, while a direction in which the wire-shaped metal layers 41 are arranged in parallel to each other is referred to as direction X.

Also note that, in describing the width W41 of the wire-shaped metal layer 41 of the wire grid 4 or the like, the width at the middle in the thickness direction of the wire-shaped metal layer 41 is defined as the width W41 of the wire-shaped metal layer 41 in cases when the width W41 of the wire-shaped metal layer 41 of the wire grid 4 differs in the thickness direction.

Figure 2:
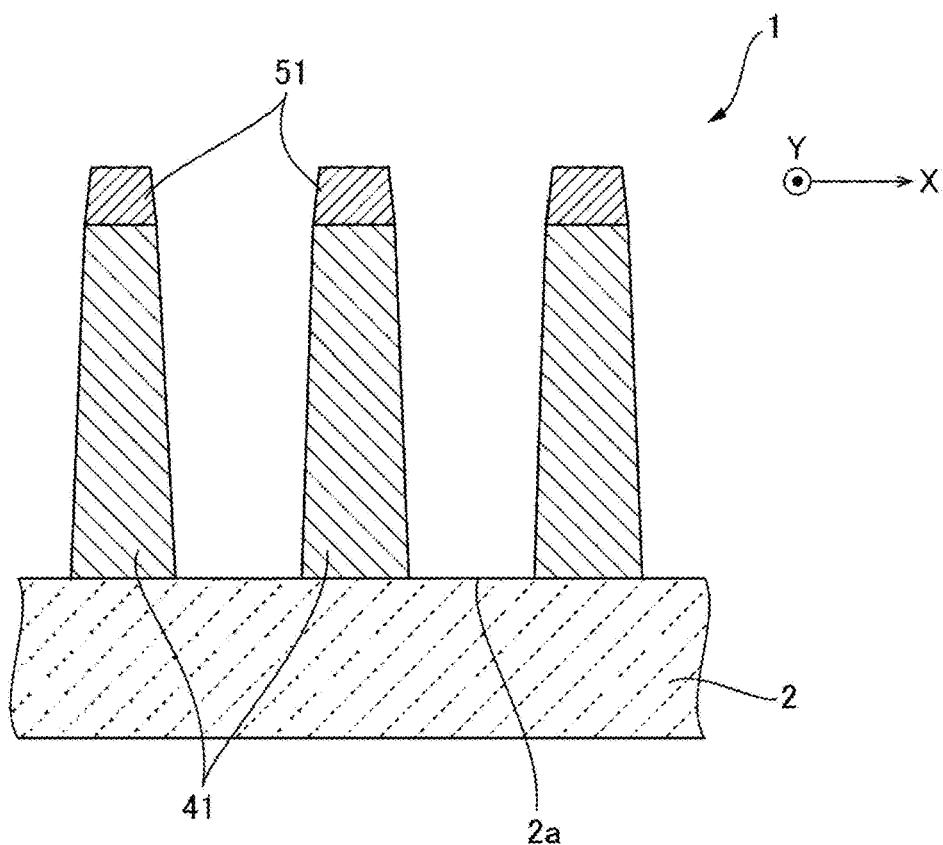
FIG. 2 is a cross-sectional view of the wire grid polarization element illustrated in FIG. 1.

Configuration of wire grid polarization element 1 FIG. 1 is an explanatory view of a wire grid polarization element to which the disclosure is applied. FIG. 2 is a cross-sectional view of the wire grid polarization element illustrated in FIG. 1. The wire grid polarization element 1 illustrated in FIG. 1 and FIG. 2 includes a substrate 2 having light translucency and the wire grid 4 made of metal formed on one surface 2a of the substrate 2. The wire grid 4 is including a plurality of wire-shaped metal layers 41 arranged in parallel to each other at an equal pitch.

As the substrate 2, a substrate having light translucency such as a glass substrate, a quartz substrate, or a crystal substrate is used. The substrate 2 is formed in a square shape having a side of from approximately 20 mm to 30 mm, both inclusive, and in a thickness of from 0.5 mm to 0.8 mm, both inclusive, for example. The width and the space (the gap between the adjacent wire-shaped metal layers 41) of the wire-shaped metal layer 41 are each 400 nm or less, for example. In the exemplary embodiment, the width and the space of the wire-shaped metal layer 41 each are, for example, from 20 nm to 300 nm, both inclusive, and the thickness of the wire-shaped metal layer 41 is from 150 nm to 400 nm, both inclusive. The wire grid 4 (the wire-shaped metal layer 41) includes aluminum, silver, copper, platinum, gold, or an alloy containing these metals as a main component. In the exemplary embodiment, in view of suppressing the absorption loss to a small value in the visible light wavelength region, the wire grid 4 includes aluminum, an alloy containing aluminum as a main component, silver, or an alloy containing silver as a main component.

In the wire grid 4 thus configured, when the pitch of the wire-shaped metal layer 41 is sufficiently shorter than the wavelength of incident light, a first linear polarization light beam included in the incident light representing a component having an electric field vector orthogonal to a longer direction of the wire-shaped metal layer 41 is passed through, while a second linear polarization light beam representing a component having an electric field vector parallel to the longer direction of the wire-shaped metal layer 41 is reflected.

As illustrated in FIG. 2, in the wire grid polarization element 1 of this embodiment, a light absorption layer 51 (not illustrated in FIG. 1) including a semiconductor film of silicon, germanium, or the like is formed on the leading end portion of the wire grid 4 on the opposite side to the substrate 2 (the leading end portion of the thin wire-shaped metal layer 41). Accordingly, the light absorption layer 51 suppresses light incident on the wire grid polarization element 1 from the opposite side to the substrate 2 from being reflected by the wire-shaped metal layer 41.

Figure 3:
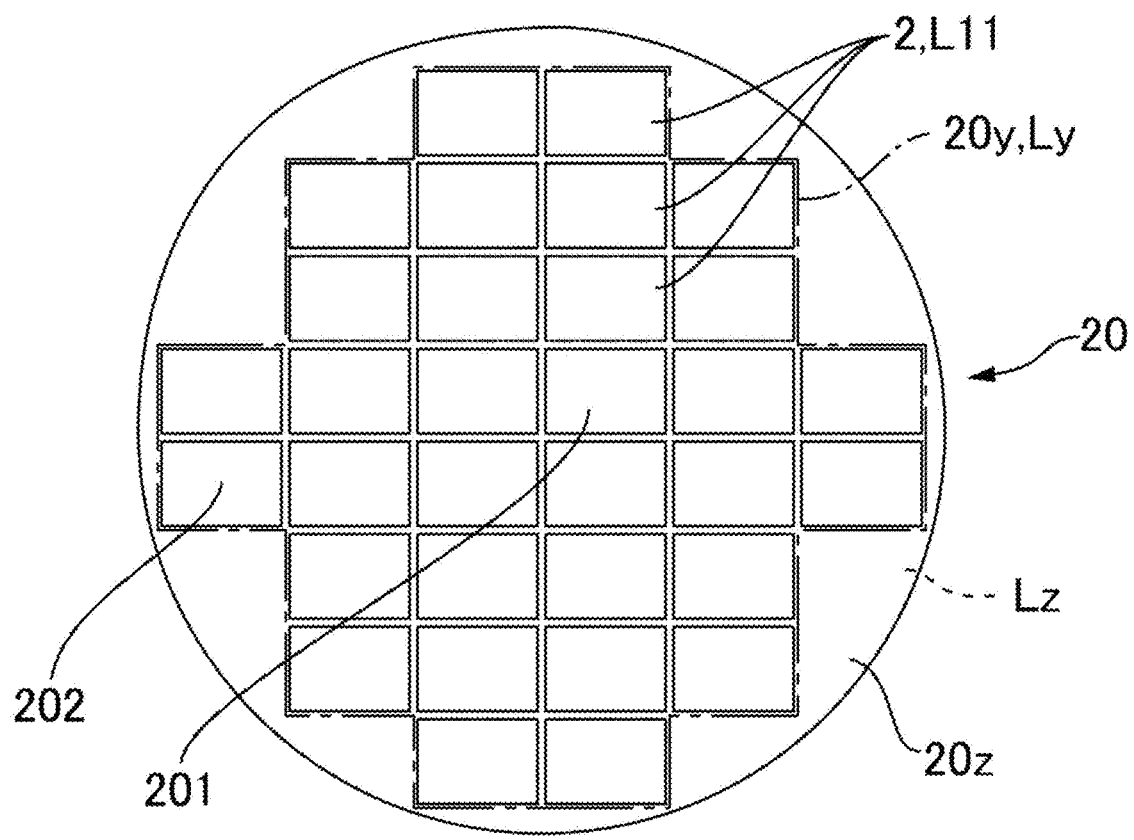
FIG. 3 is an explanatory view of a mother substrate used in a method of manufacturing the wire grid polarization element illustrated in FIG. 1.
Figure 4:
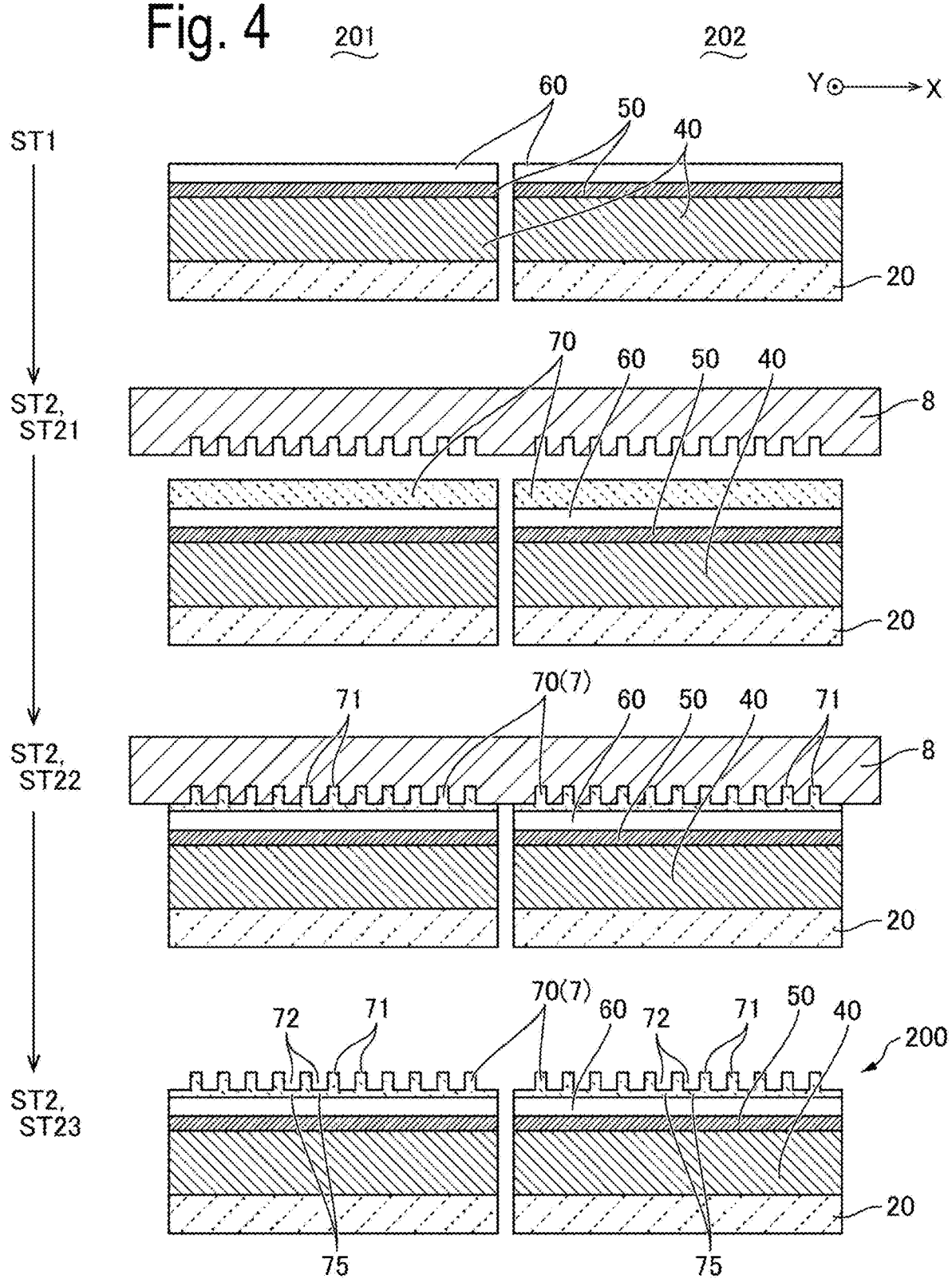
FIG. 4 is a process cross-sectional view of a film-forming step and a resist mask forming step in a manufacturing process of the wire grid polarization element illustrated in FIG. 1.
Figure 5:
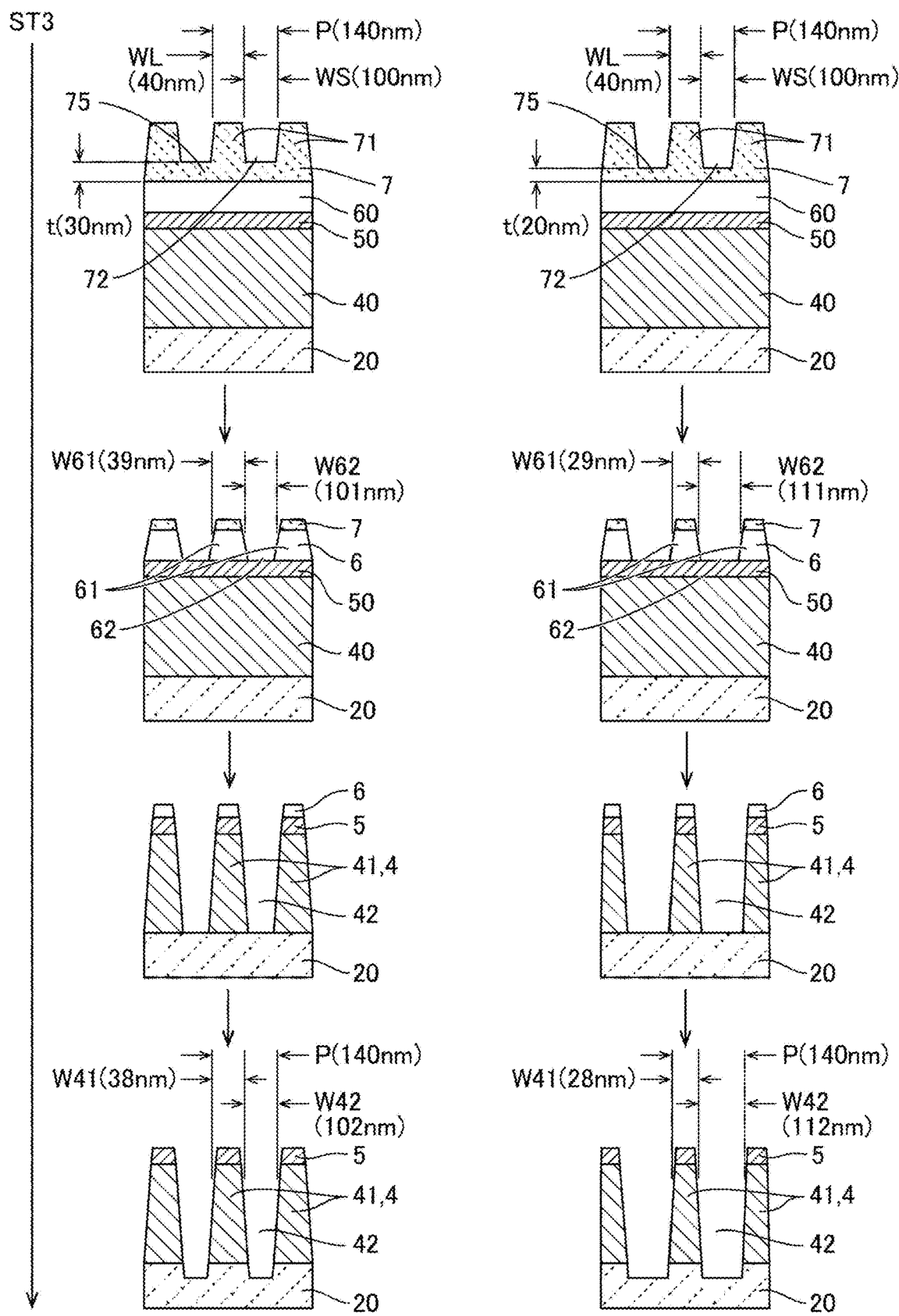
FIG. 5 is a process cross-sectional view of an etching step in the manufacturing process of the wire grid polarization element illustrated in FIG. 1.

Method of manufacturing wire grid polarization element 1 FIG. 3 is an explanatory view of a mother substrate 20 used in a method of manufacturing the wire grid polarization element 1 illustrated in FIG. 1. FIG. 4 is a process cross-sectional view of a film-forming step and a resist mask forming step in a manufacturing process of the wire grid polarization element 1 illustrated in FIG. 1. FIG. 5 is a process cross-sectional view of an etching step in the manufacturing process of the wire grid polarization element 1 illustrated in FIG. 1. Note that FIG. 4 and FIG. 5 depict the center region (e.g., a center region 201 illustrated in FIG. 3) of the mother substrate 20 illustrated in FIG. 3 on the left side (a), while depict the peripheral region (e.g., a peripheral region 202 illustrated in FIG. 3) of the mother substrate 20 on the right side (b).

In manufacturing the wire grid polarization element 1 illustrated in FIG. 1 in this embodiment, the mother substrate 20 illustrated in FIG. 3 is used to form the wire grid 4 followed by a division of the mother substrate 20 to produce a plurality of wire grid polarization elements 1 at least until the wire grid 4 illustrated in FIG. 1 is formed. The mother substrate 20, which is a large sized substrate capable of producing multiple substrates 2 indicated by a solid line L11, is formed in a disk shape like a silicon wafer. In the mother substrate 20, a region (a region surrounded by a dashed line Ly) from which a plurality of substrates 2 are cut out serves as an effective region 20y, and the other region serves as an ineffective region 20z (removal material region/outside of the region surrounded by the dashed line Ly).

In forming the wire grid 4, first, in a film-forming step ST1 illustrated in FIG. 4, a metal film 40, a light absorption film 50, and an inorganic material film 60 for hard mask are sequentially formed on the mother substrate 20 illustrated in FIG. 3. In this embodiment, the metal film 40 is an aluminum film having a thickness of 240 nm. The light absorption film 50 is a semiconductor film such as a silicon film or a germanium film that have a thickness of 26 nm. The inorganic material film 60 for hard mask is a silicon oxide film having a thickness of 100 nm.

Next, a resist mask forming step ST2 illustrated in FIG. 4 is performed. In a resist mask coating step ST21 of the resist mask forming step ST2, a resist layer 70 is coated on one surface 20a of the mother substrate 20, and then in a transfer step ST22, a mold material 8 for nanoimprinting is pressed against the resist layer 70 to transfer to the resist layer 70, a plurality of convex portions 71 arranged in parallel to each other at a pitch equivalent to the pitch of the plurality of wire-shaped metal layers 41. Next, in a release step ST23, the mold material 8 is released from the resist layer 70. A curing of the resist layer 70 may be performed between the transfer step ST22 and the release step ST23. The curing of the resist layer 70 may alternatively be performed after the release step ST23. In this embodiment, a UV curable resist is used for the resist layer 70. Accordingly, a use of the mold material 8 having permeability to ultraviolet light allows the resist layer 70 to be irradiated, prior to the release step ST23, with ultraviolet light UV incident from the opposite side to the resist layer 70 relative to the mold material 8, to cause the resist layer 70 to be cured. Alternatively, the resist layer 70 may be irradiated, after the release step ST23, with ultraviolet light UV from the opposite side to the mother substrate 20 to cause the resist layer 70 to be cured.

In forming a resist mask 7 in this embodiment, the resist mask 7 (the residual film 75) is made remaining at the bottom portion of a concave portion 72 interposed between the adjacent convex portions 71. Accordingly, the resist layers 70 each of which constituting the convex portion 71 are coupled to each other via the resist layer 70 constituting the bottom portion of the concave portion 72. This prevents the resist layer constituting the convex portion 71 from being peeled off when the mold material 8 is released after the mold material 8 is pressed against the resist layer 70 to transfer the convex portion 71 to the resist layer 70.

Next, in an etching step ST3 illustrated in FIG. 5, a dry etching is performed with the resist mask 7 being formed, and thus the patternings of the metal film 40 and the light absorption film 50 are each performed to form a shape corresponding to the pattern shape of the resist mask 7, to form the wire grid 4. In the etching step ST3, first, a first anisotropic dry etching using an etching gas containing fluorine and oxygen is performed, and then a second anisotropic dry etching using an etching gas containing chlorine is performed.

In the first anisotropic dry etching, the resist mask 7 and the inorganic material film 60 are etched, where the inorganic material film 60 is patterned into a hard mask 6 having a shape corresponding to the pattern shape of the resist mask 7. In the second anisotropic dry etching, the metal film 40 is etched, where the metal film 40 is patterned into the wire-shaped metal layers 41 having a shape corresponding to the pattern shape of the hard mask 6 (the pattern shape of the resist mask 7). On this occasion, the light absorption film 50 is also patterned into a shape corresponding to the pattern shape of the hard mask 6 (the pattern shape of the resist mask 7).

Next, a third anisotropic dry etching using an etching gas containing fluorine is performed to remove the hard mask 6 remaining on the wire-shaped metal layer 41. During the above process, on one surface 20a of the mother substrate 20, the portion interposed between the wire-shaped metal layers 41 is etched to a depth of, for example, 70 nm. Thereafter, the mother substrate 20 is divided to produce a plurality of wire grid polarization elements 1.

Discussion Results on Residual Film 75
Variation of Thickness t of Residual Film 75 and Width W41 of Wire-Shaped Metal Layer 41

In FIG. 5, there is exemplified a case where the maximum thickness of the resist mask 7 is 150 nm, the width WL of the convex portion 71 of the resist mask 7 is 40 nm, and the width WS of the concave portion 72 is 100 nm (the pitch P of the wire-shaped metal layer 41 is 140 nm). In the resist mask 7, the width WL of the convex portion 71, the width WS of the concave portion 72, and the pitch P of the wire-shaped metal layer 41 are equal to one another at the center region 201 and the peripheral region 202 on the mother substrate 20 illustrated in FIG. 3.

In this situation, when the resist mask 7 (the residual film 75) is remaining at the bottom portion of the concave portion 72, the thickness of the residual film 75 may vary depending on the position on the mother substrate 20. For example, in the center region 201 on the mother substrate 20, the thickness t of the residual film 75 is 30 nm, whereas in the peripheral region 202 on the mother substrate 20, the thickness t of the residual film 75 may reach 20 nm, where the difference Δt between the maximum value and the minimum value of the thickness t of the residual film 75 reaches 10 nm. In this case, when the etching step ST3 is performed to form the hard mask 6, the residual film 75 is removed in the peripheral region 202 at an earlier timing than in the center region 201. The etching time is set in accordance with the thickness of the residual film 75 having thicker film thickness.

Accordingly, in the hard mask 6, the width W61 of the linear portion 61 overlapping with the resist mask 7 in the peripheral region 202 is made narrower than the width W61 of the linear portion 61 overlapping with the resist mask 7 in the center region 201. In other words, the width W62 of the space 62 interposed between the linear portions 61 in the peripheral region 202 is made wider than the width W62 of the space 62 interposed between the linear portions 61 in the center region 201. For example, in the center region 201, the width W61 of the linear portion 61 is 39 nm, whereas in the peripheral region 202, the width W61 of the linear portion 61 reaches 29 nm. In other words, in the peripheral region 202, the width W62 of the space 62 is 101 nm, whereas in the center region 201, the width W62 of the space 62 reaches 111 nm.

Accordingly, at the time when the etching on the metal film 40 is terminated, the width WL41 of the wire-shaped metal layer 41 in the peripheral region 202 is made narrower than the width WL41 of the wire-shaped metal layer 41 in the center region 201. In other words, the width W42 of the space 42 interposed between the wire-shaped metal layers 41 in the peripheral region 202 is made wider than the width W42 of the space 42 interposed between the wire-shaped metal layers 41 in the center region 201. For example, the width WL41 of the wire-shaped metal layer 41 in the center region 201 reaches 38 nm, whereas the width WL41 of the wire-shaped metal layer 41 in the peripheral region 202 reaches 28 nm. In other words, in the center region 201, the width WS42 of the space 42 interposed between the adjacent wire-shaped metal layers 41 is 102 nm, whereas in the peripheral region 202, the width WS42 of the space 42 interposed between the adjacent wire-shaped metal layers 41 reaches 112 nm.

As such, in the region where the residual film 75 is thinner, the width W61 of the linear portion 61 of the hard mask 6 is narrowed, thus the width WL41 of the wire-shaped metal layer 41 is narrowed in the wire grid 4. Accordingly, the width W41 of the wire-shaped metal layer 41 is different between in the wire grid polarization element 1 divided from the center region 201 on the mother substrate 20 and in the wire grid polarization element 1 divided from the peripheral region 202 on the mother substrate 20. For example, in the wire grid polarization element 1 divided from the peripheral region 202 on the mother substrate 20, the width W41 of the wire-shaped metal layer 41 is made narrower than in the wire grid polarization element 1 divided from the center region 201. As a result, a difference occurs in the optical properties between the wire grid polarization element 1 produced from the center region 201 and the wire grid polarization element 1 produced from the peripheral region 202.

Relationship Between Difference Δt of Thickness t of Residual Film 75 and Width W41 of Wire-Shaped Metal Layer 41

Figure 6:
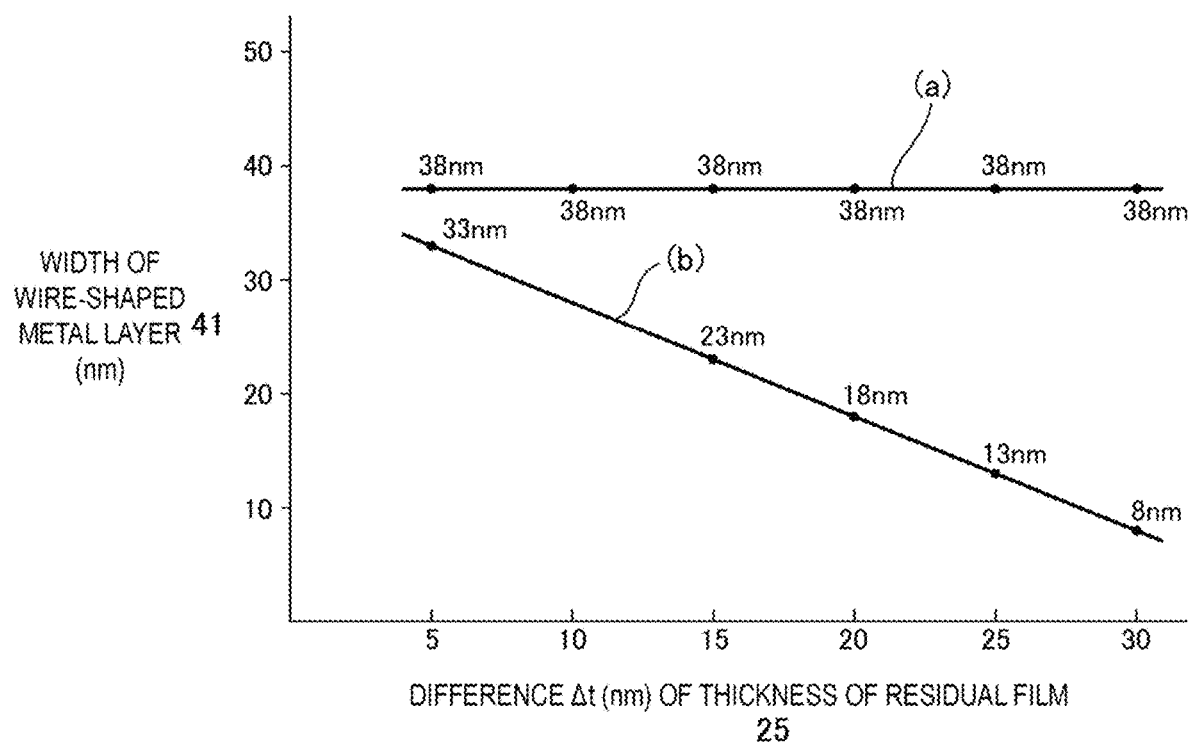
FIG. 6 is a graph for explaining a relationship between the difference of the thickness of the residual film and the width of the wire-shaped metal layer illustrated in FIG. 5.

FIG. 6 is a graph for explaining a relationship between the difference Δt of the thickness t of the residual film 75 and the width W41 of the wire-shaped metal layer 41 illustrated in FIG. 5. FIG. 6 illustrates the relationship between the difference Δt of the thickness t of the residual film 75 and the width W41 of the wire-shaped metal layer 41 in the peripheral region 202 where the thickness t of the residual film 75 is thinner, in the case when the etching time and the like are set such that the width W41 of the wire-shaped metal layer 41 reaches 38 nm in the center region 201 where the thickness t of the residual film 75 is thicker.

As illustrated in FIG. 6, in a case where the condition is set such that the width W41 of the wire-shaped metal layer 41 reaches 38 nm in the center region 201 where the thickness t of the residual film 75 is thicker under a condition that the difference Δt between the maximum value and the minimum value of the thickness t of the residual film 75 is varied from 5 nm to 30 nm, as the difference Δt of the thickness t of the residual film 75 is increased, the width W41 of the wire-shaped metal layer 41 is narrowed from 33 nm to 8 nm in the peripheral region 202 where the thickness t of the residual film 75 is thinner. Further, the difference between the width W41 of the wire-shaped metal layer 41 in the center region 201 and the same in the peripheral region 202 is substantially equal to the difference Δt of the thickness t of the residual film 75. This tendency is also applicable to the case where the pitch P is varied.

Figure 7A:
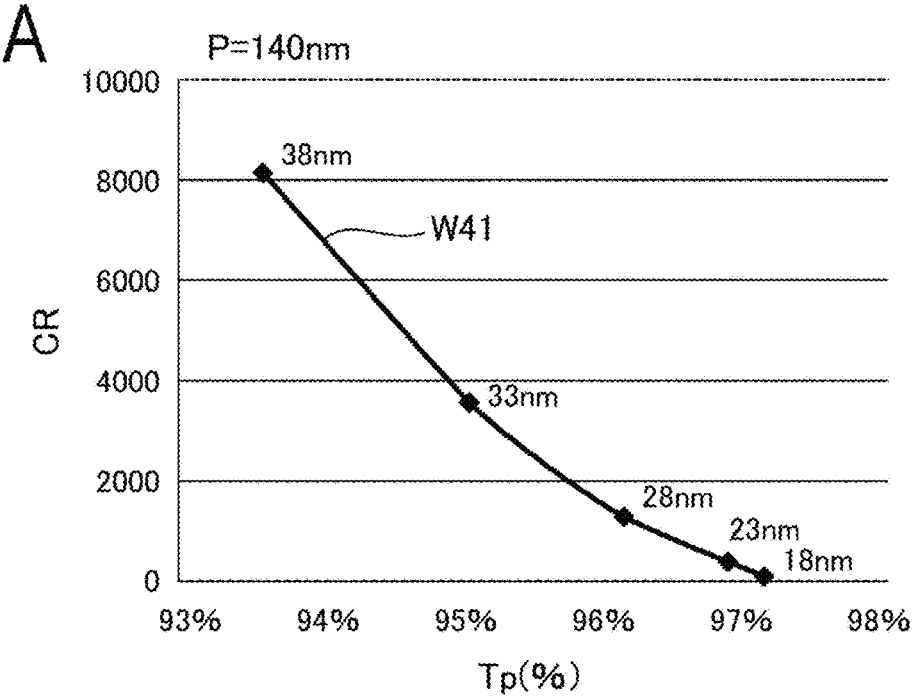
FIGS. 7A and 7B are graphs for explaining a relationship between the width of the wire-shaped metal layer and the polarization properties when the pitch of the wire-shaped metal layer is set at 140 nm.
Figure 7B:
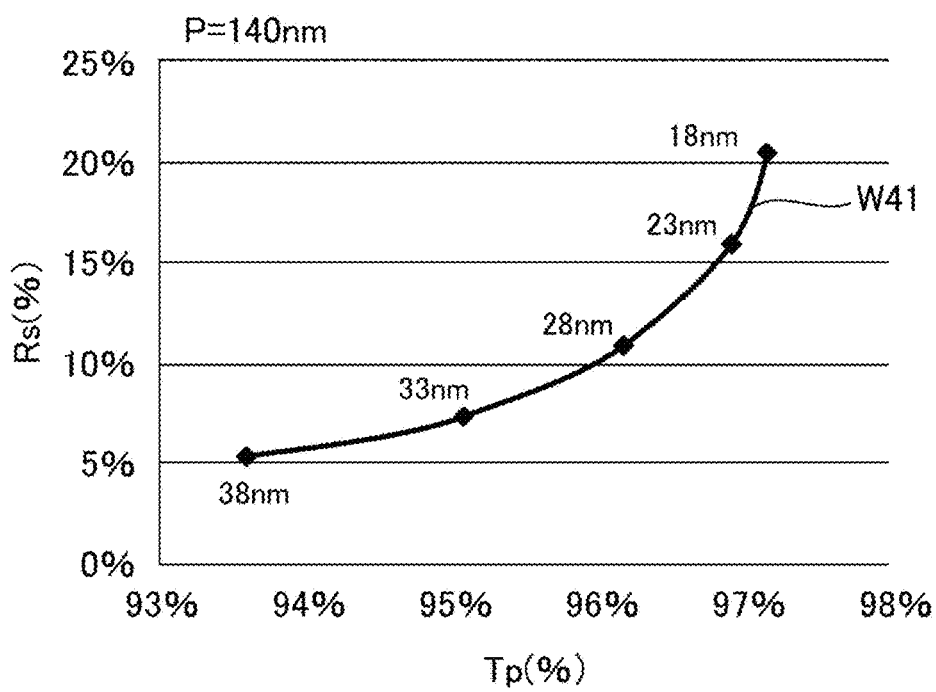
Figure 8A:
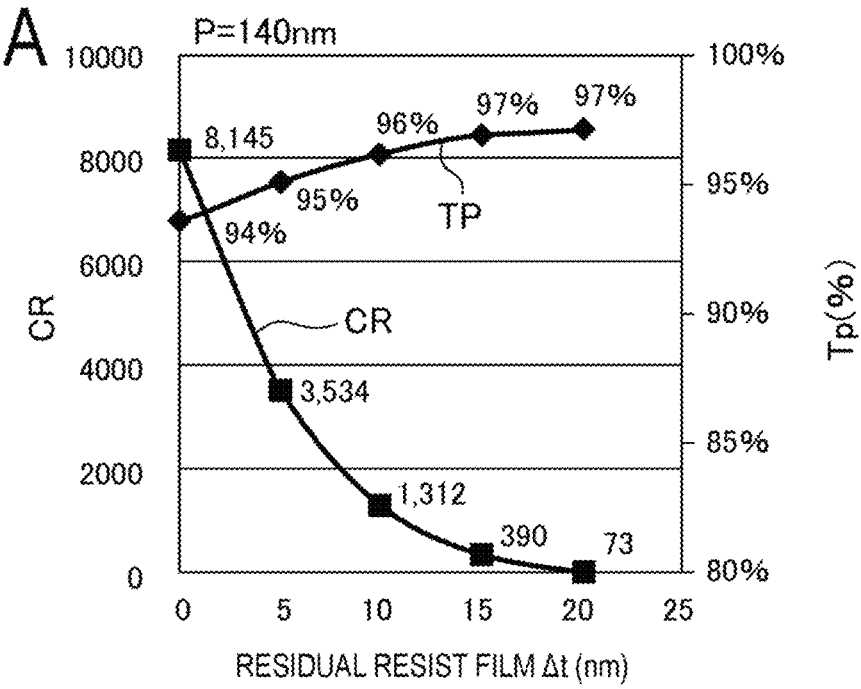
FIGS. 8A and 8B are graphs for explaining a relationship between the variation of the residual film and the polarization properties when the pitch of the wire-shaped metal layer is set at 140 nm.
Figure 8B:
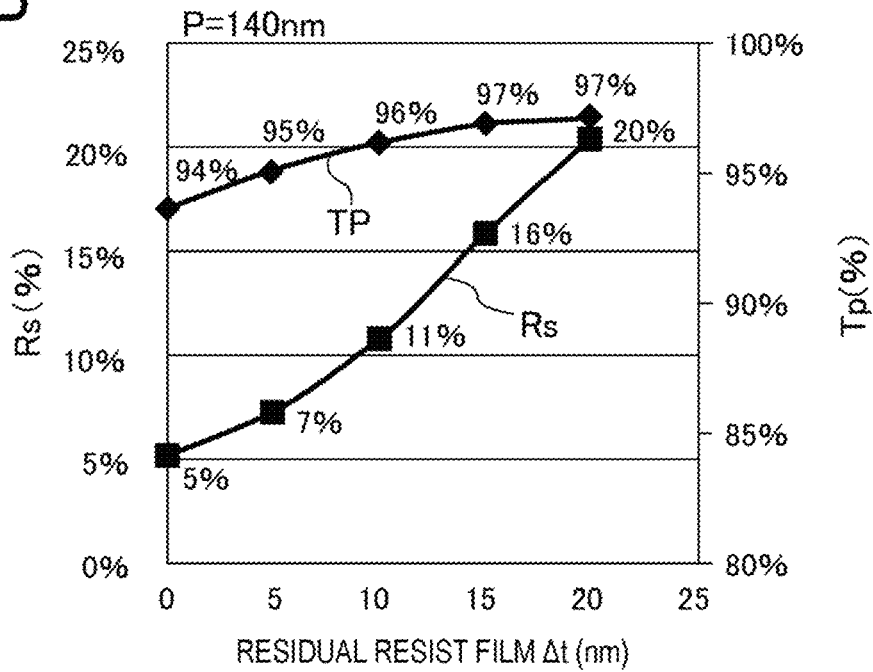

Upper limit of variation of residual film 75 when pitch P is 140 nm FIGS. 7A and 7B are graphs for explaining a relationship between the width WL41 of the wire-shaped metal layer 41 and the polarization properties when the pitch P of the wire-shaped metal layers 41 is set at 140 nm. FIGS. 8A and 8B are graphs for explaining a relationship between the variation (difference Δt) of a residual film 75 and the polarization properties when the pitch P of the wire-shaped metal layers 41 is set at 140 nm, where the properties of the wire grid polarization element 1 produced from the peripheral region 202 are illustrated. The polarization properties, the contrast ratio CR, and the like that will be described below represent average values for light having wavelength of from 500 nm to 590 nm.

First, as illustrated in FIGS. 7A and 7B, when the width WL41 of the wire-shaped metal layer 41 is narrowed from 38 nm to 18 nm, the light transmittance Tp with respect to the p-polarized light beam and the light reflectance Rs with respect to the s-polarized light beam are increased. Further, the contrast ratio CR being the ratio between light transmittances of the wire grid polarization element 1 with respect to two linearly polarized light (p-polarized light and s-polarized light) having the electric field vibration directions orthogonal to each other, is decreased. Accordingly, in a case where the difference Δt of the thickness t of the residual film 75 is large, the width W41 of the wire-shaped metal layer 41 is narrowed in the peripheral region 202 where the thickness t of the residual film 75 is thinner, when the etching time and the like are set such that the width W41 of the wire-shaped metal layer 41 reaches 38 nm in the center region 201 where the thickness t of the residual film 75 is thicker. Thus, as illustrated in FIGS. 8A and 8B, as the difference Δt of the thickness t of the residual film 75 is increased, the contrast ratio CR is decreased in the wire grid polarization element 1 produced from the peripheral region 202.

Accordingly, conditions (the width WL41 of the wire-shaped metal layer 41) for ensuring the contrast ratio CR of 100 or greater, or 500 or greater are derived based on the results illustrated in FIGS. 7A and 7B and FIGS. 8A and 8B, then the following results are obtained:
  CR is 100 or greater (where pitch P=140 nm)
  Width WL41 of wire-shaped metal layer 41: WL41≥19 nm
  CR is 500 or greater (where pitch P=140 nm)
  Width WL41 of wire-shaped metal layer 41: WL41≥25 nm Conditions of the residual film 75 (the difference Δt of the thickness t, and Δt/P) which correspond to the above conditions result in the following results:
  CR is 100 or greater (where pitch P=140 nm)
  Difference Δt≤19.5 nm
  Δt/P≤13.9%
  CR is 500 or greater (where pitch P=140 nm)
  Difference Δt≤14.1 nm
  Δt/P≤10.1%

Upper limit of variation of residual film 75 when pitch P is 120 nm

Figure 9A:
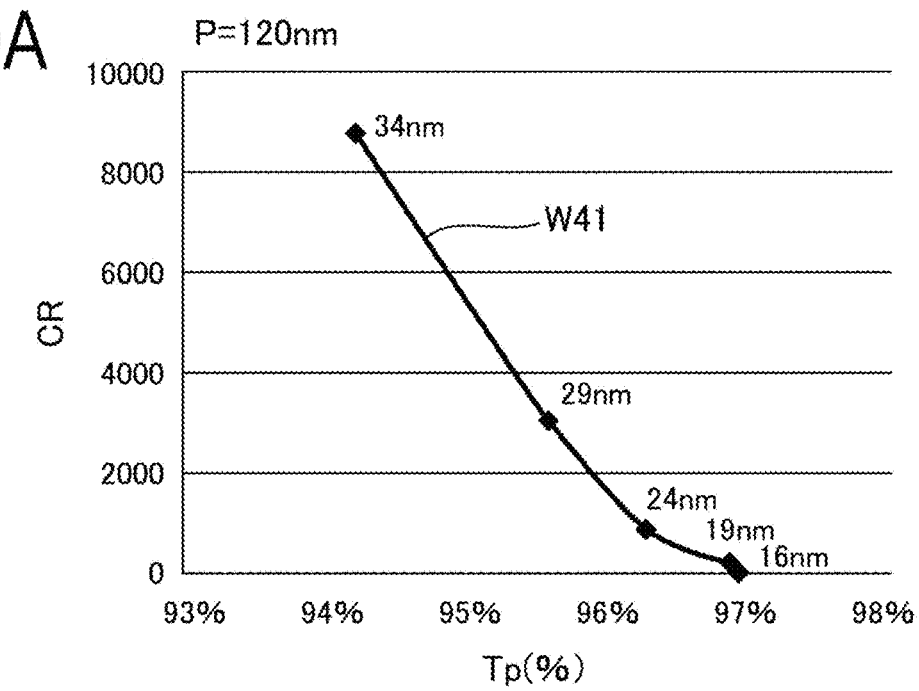
FIGS. 9A and 9B are graphs for explaining a relationship between the width of the wire-shaped metal layer and the polarization properties when the pitch of the wire-shaped metal layer is set at 120 nm.
Figure 9B:
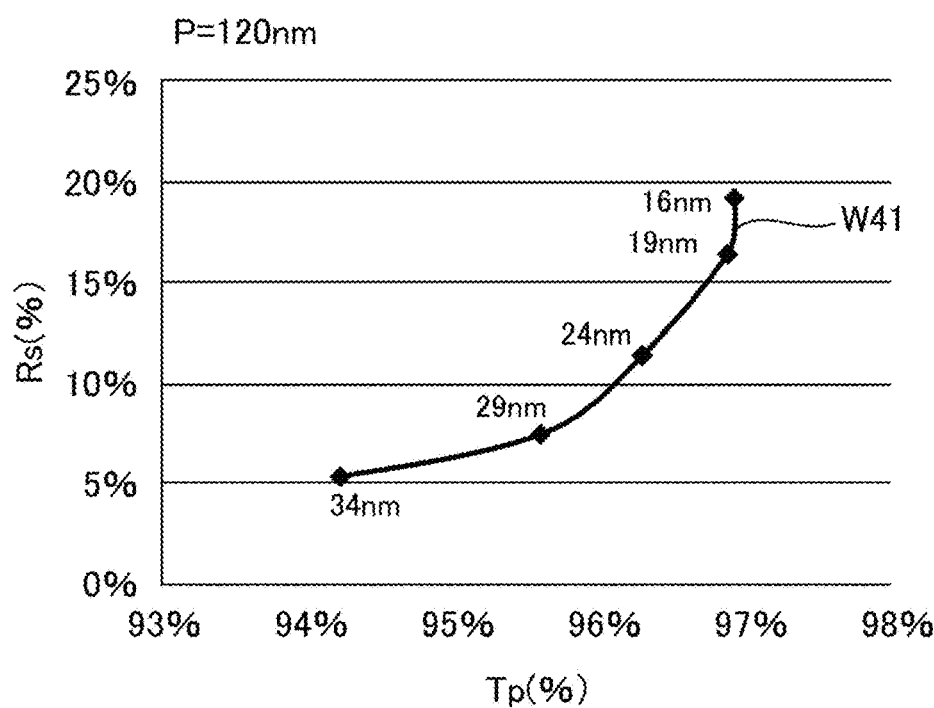
Figure 10A:
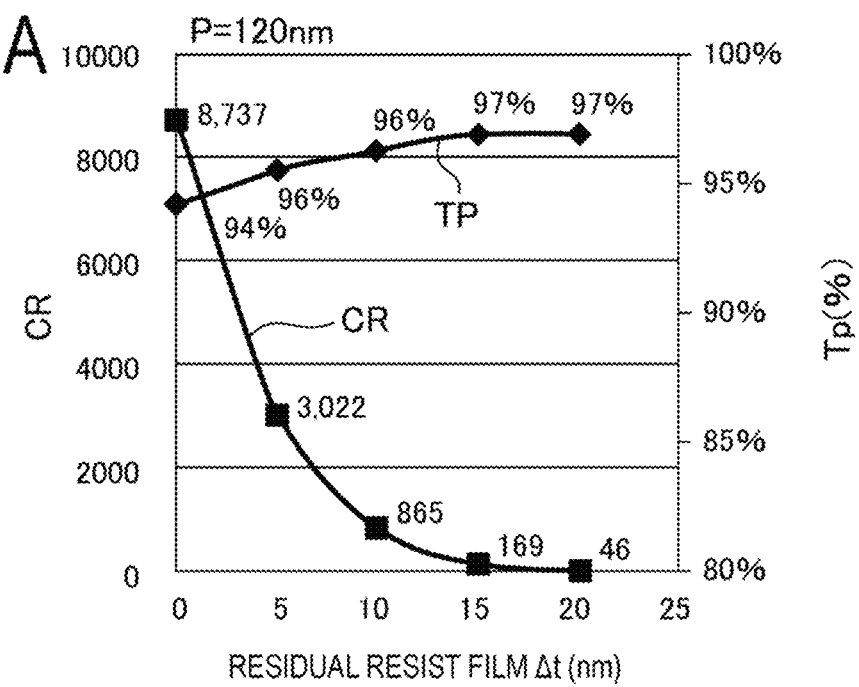
FIGS. 10A and 10B are graphs for explaining a relationship between the variation of residual film and the polarization properties when the pitch of the wire-shaped metal layer is set at 120 nm.
Figure 10B:
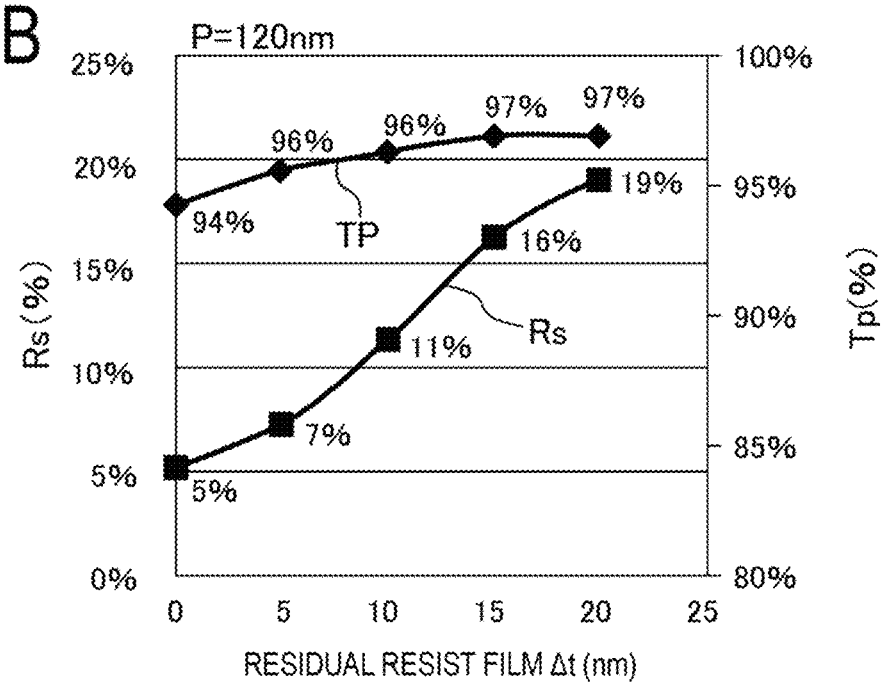

FIGS. 9A and 9B are graphs for explaining a relationship between the width WL41 of the wire-shaped metal layer 41 and the polarization properties when the pitch P of the wire-shaped metal layers 41 is set at 120 nm. FIGS. 10A and 10B are graphs for explaining a relationship between the variation (difference Δt) of the residual film 75 and the polarization properties when the pitch P of the wire-shaped metal layers 41 is set at 120 nm, where the properties of the wire grid polarization element 1 produced from the peripheral region 202 are illustrated. Note that when the pitch P is set at 120 nm, the height of the wire-shaped metal layer 41 is set at 215 nm and the thickness of the light absorption layer 5 is set at 27 nm. Also note that the target value of the width W41 of the wire-shaped metal layer 41 is set at 34 nm. Also note that the width WL of the convex portion 71 in the resist mask 7 illustrated in FIG. 5 is set at 36 nm, and the thickness t of the residual film 75 is set at 30 nm in the center region 201 on the mother substrate 20.

First, as illustrated in FIGS. 9A and 9B, in the case when the pitch P is 120 nm as in the case where the pitch P is 140 nm, the light transmittance Tp with respect to the p-polarized light beam and the light reflectance Rs with respect to the s-polarized light beam are increased when the width WL41 of the wire-shaped metal layer 41 is narrowed from 34 nm to 16 nm. Further, the contrast ratio CR being the ratio between light transmittances of the wire grid polarization element 1 with respect to two linearly polarized light (p-polarized light and s-polarized light) having the electric field vibration directions orthogonal to each other, is decreased. Accordingly, in a case where the difference Δt of the thickness t of the residual film 75 is large, the width W41 of the wire-shaped metal layer 41 is narrowed in the peripheral region 202 where the thickness t of the residual film 75 is thinner, when the etching time and the like are set such that the width W41 of the wire-shaped metal layer 41 reaches 34 nm in the center region 201 where the thickness t of the residual film 75 is thicker. Thus, as illustrated in FIGS. 10A and 10B, as the difference Δt of the thickness t of the residual film 75 is increased, the contrast ratio CR is decreased in the wire grid polarization element 1 produced from the peripheral region 202.

Accordingly, conditions (the width WL41 of the wire-shaped metal layer 41) for ensuring the contrast ratio CR of 100 or greater, or 500 or greater are derived based on the results illustrated in FIGS. 9A and 9B and FIGS. 10A and 10B, then the following results are obtained:
  CR is 100 or greater (where pitch P=120 nm)
  Width WL41 of wire-shaped metal layer 41: WL41≥18 nm
  CR is 500 or greater (where pitch P=120 nm)
  Width WL41 of wire-shaped metal layer 41: WL41≥23 nm Conditions of the residual film 75 (the difference Δt of the thickness t, and Δt/P) which correspond to the above conditions result in the following results:
  CR is 100 or greater (where pitch P=120 nm)
  Difference Δt≤16.1 nm
  Δt/P≤13.4%
  CR is 500 or greater (where pitch P=120 nm)
  Difference Δt≤11.6 nm
  Δt/P≤9.7%

Upper limit of variation of residual film 75 when pitch P is 120 nm

Figure 11A:
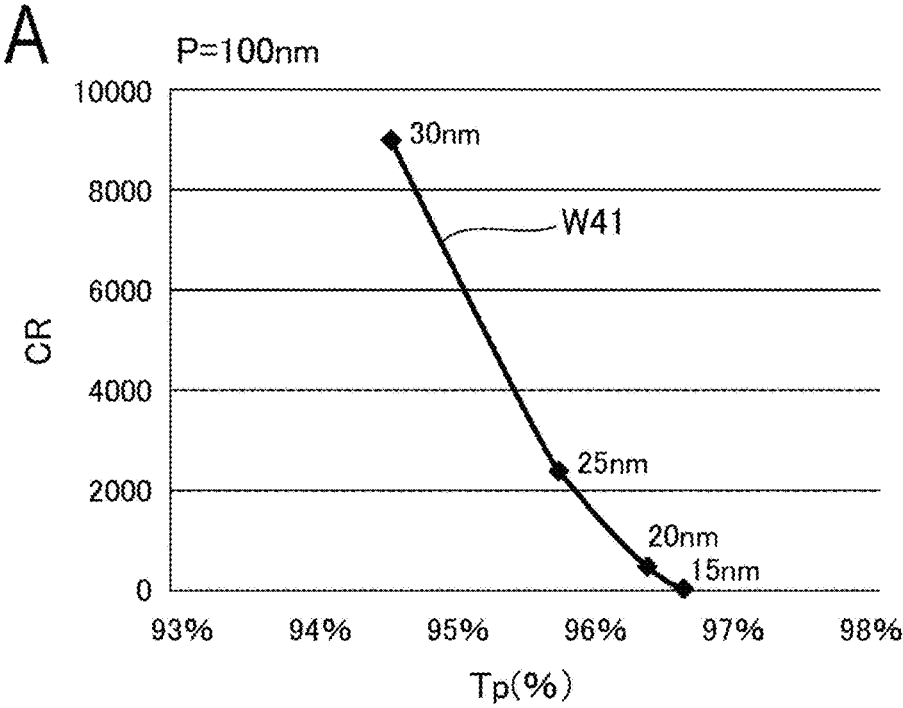
FIGS. 11A and 11B are graphs for explaining a relationship between the width of the wire-shaped metal layer and the polarization properties when the pitch of the wire-shaped metal layer is set at 100 nm.
Figure 11B:
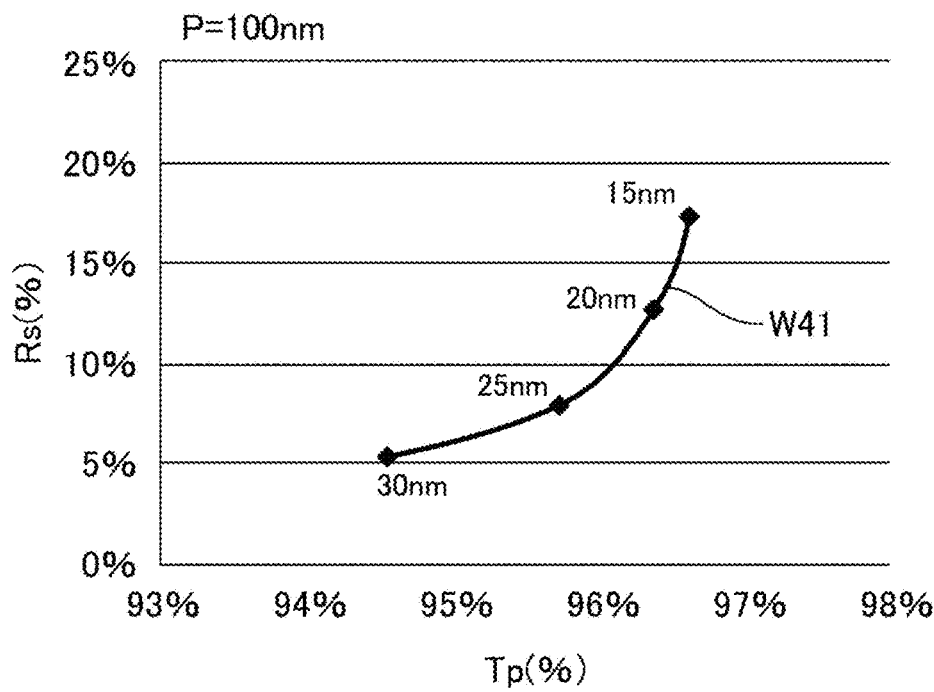
Figure 12A:
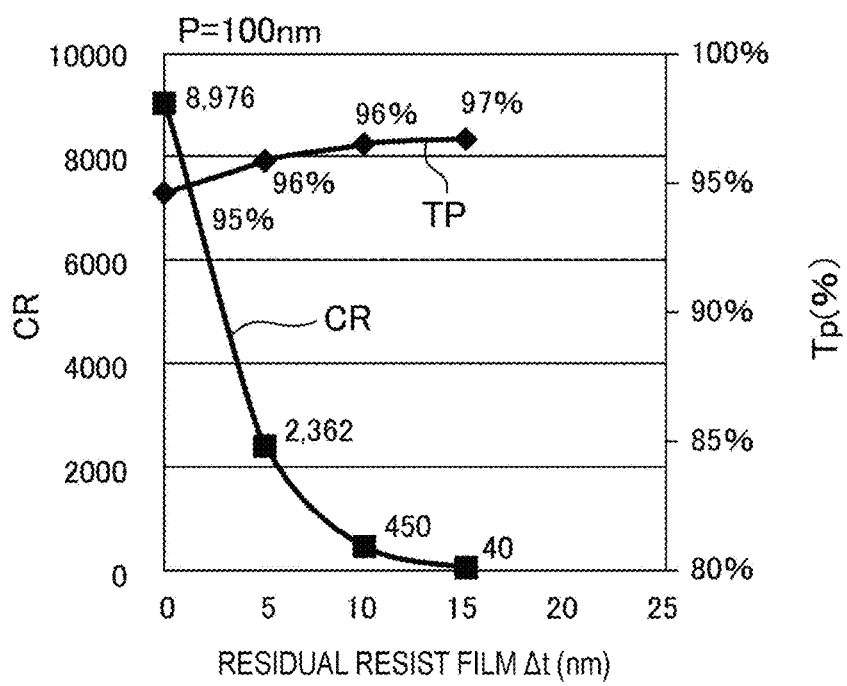
FIGS. 12A and 12B are graphs for explaining a relationship between the variation of the residual film and the polarization properties when the pitch of the wire-shaped metal layer is set at 100 nm.
Figure 12B:
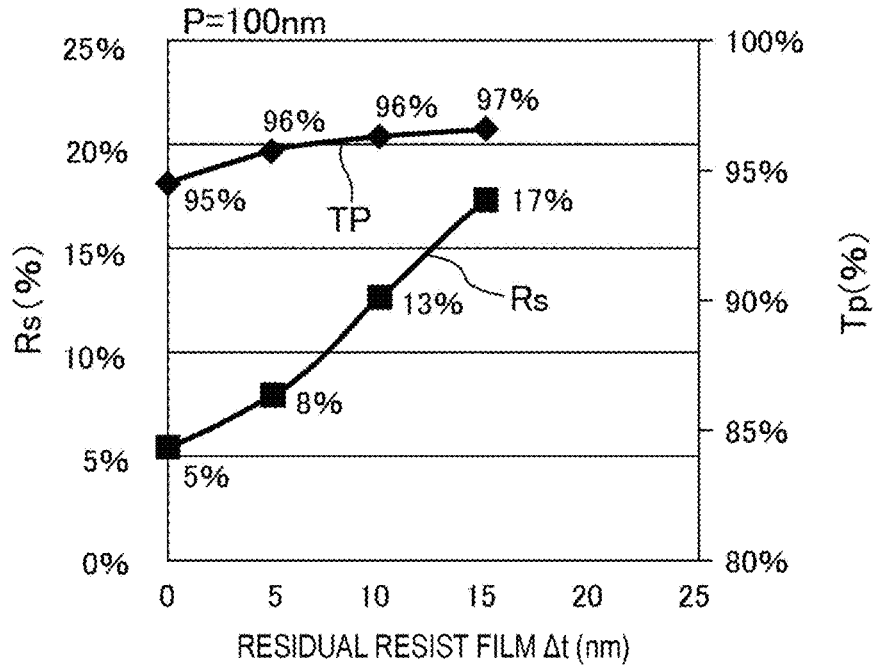

FIGS. 11A and 11B are graphs for explaining a relationship between the width WL41 of the wire-shaped metal layer 41 and the polarization properties when the pitch P of the wire-shaped metal layers 41 is set at 100 nm. FIGS. 12A and 12B are graphs for explaining a relationship between the variation (difference Δt) of the residual film 75 and the polarization properties when the pitch P of the wire-shaped metal layers 41 is set at 100 nm, where the properties of the wire grid polarization element 1 produced from the peripheral region 202 are illustrated. Note that when the pitch P is set at 100 nm, the height of the wire-shaped metal layer 41 is set at 195 nm and the thickness of the light absorption layer 5 is set at 27 nm. Also note that the target value of the width W41 of the wire-shaped metal layer 41 is set at 30 nm. Also note that the width WL of the convex portion 71 in the resist mask 7 illustrated in FIG. 5 is set at 32 nm, and the thickness t of the residual film 75 is set at 30 nm in the center region 201 on the mother substrate 20.

First, as illustrated in FIGS. 11A and 11B, in the case when the pitch P is 100 nm as in the cases where the pitch P is 120 mm and 140 nm respectively, the light transmittance Tp with respect to the p-polarized light beam and the light reflectance Rs with respect to the s-polarized light beam are increased when the width WL41 of the wire-shaped metal layer 41 is narrowed from 30 nm to 15 nm. Further, the contrast ratio CR being the ratio between light transmittances of the wire grid polarization element 1 with respect to two linearly polarized light (p-polarized light and s-polarized light) having the electric field vibration directions orthogonal to each other, is decreased. Accordingly, in a case where the difference Δt of the thickness t of the residual film 75 is large, the width W41 of the wire-shaped metal layer 41 is narrowed in the peripheral region 202 where the thickness t of the residual film 75 is thinner, when the etching time or the like is set such that the width W41 of the wire-shaped metal layer 41 reaches 30 nm in the center region 201 where the thickness t of the residual film 75 is thicker. Thus, as illustrated in FIGS. 12A and 12B, as the difference Δt of the thickness t of the residual film 75 is increased, the contrast ratio CR is decreased in the wire grid polarization element 1 produced from the peripheral region 202.

Accordingly, conditions (the width WL41 of the wire-shaped metal layer 41) for ensuring the contrast ratio CR of 100 or greater, or 500 or greater are derived based on the results illustrated in FIGS. 11A and 11B and FIGS. 12A and 12B, then the following results are obtained:

CR is 100 or greater (where pitch P=100 nm)
Width WL41 of wire-shaped metal layer 41: WL41≥17 nm
CR is 500 or greater (where pitch P=100 nm)
Width WL41 of wire-shaped metal layer 41: WL41≥21 nm Conditions of the residual film 75 (the difference Δt of the thickness t, and Δt/P) which correspond to the above conditions result in the following results:

CR is 100 or greater (where pitch P=100 nm)
Difference Δt≤13.9 nm
Δt/P≤13.9%
CR is 500 or greater (where pitch P=100 nm)
Difference Δt≤9.7 nm
Δt/P≤9.7%

Upper Limit of Difference Δt of Thickness t of Residual Film 75 and the Like

Figure 13:
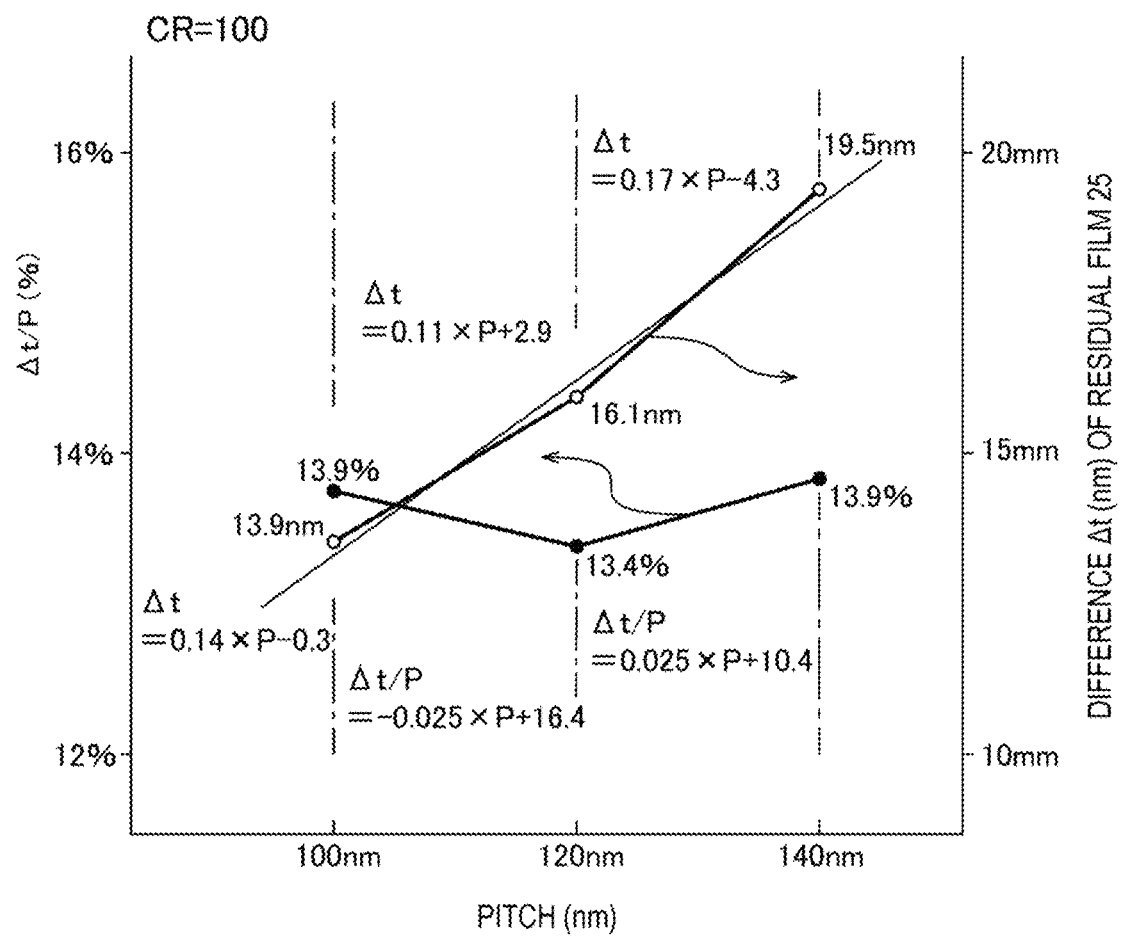
FIG. 13 is a graph for explaining a relationship between the pitch and the difference of the thickness of the residual film and the like when the contrast is to be 100.
Figure 14:
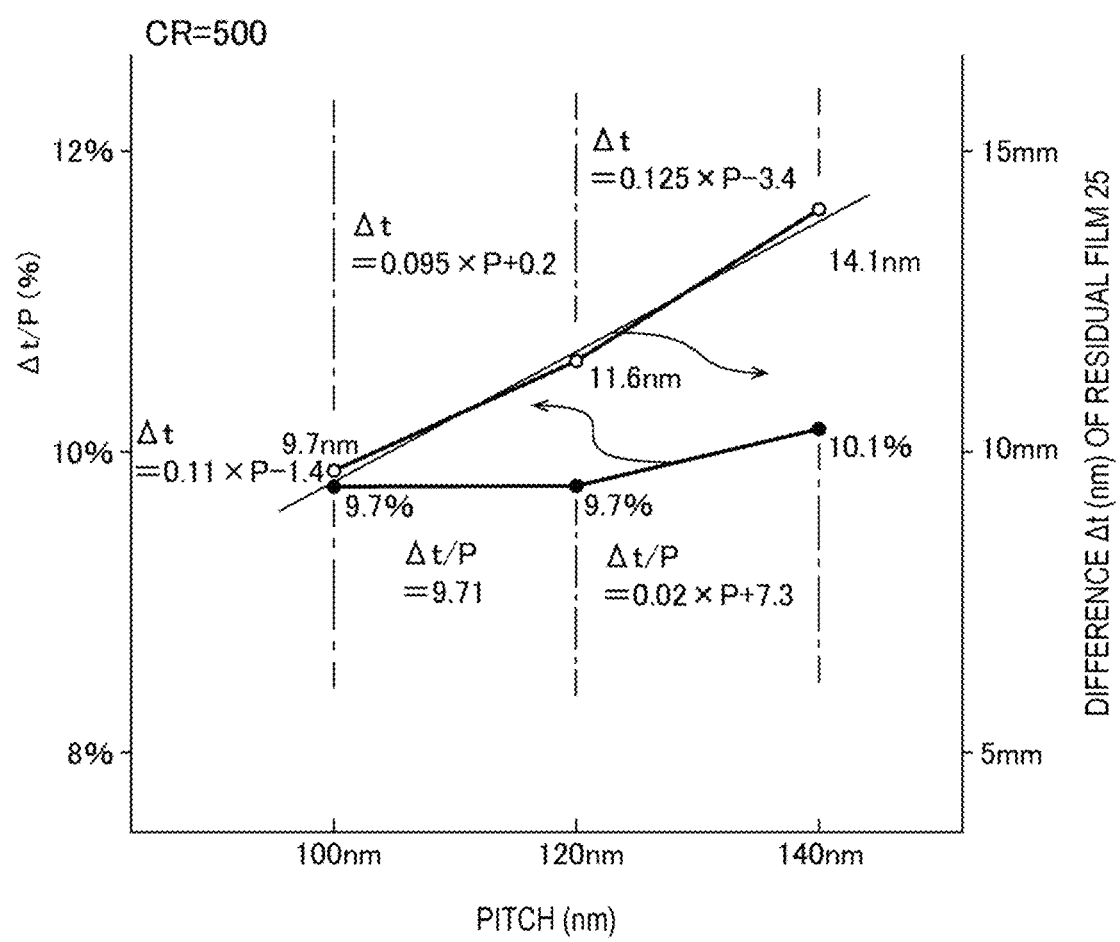
FIG. 14 is a graph for explaining a relationship between the pitch and the difference of the thickness of the residual film and the like when the contrast is to be 500.

The above results are summarized in FIG. 13 and FIG. 14. FIG. 13 is a graph for explaining a relationship between the pitch P and the difference Δt of the thickness t of the residual film 75 and the like when the contrast CR is to be 100. FIG. 14 is a graph for explaining a relationship between the pitch P and the difference Δt of the thickness t of the residual film 75 and the like when the contrast CR is to be 500.

As illustrated in FIG. 13, assuming that the following conditions are met by controlling or managing the conditions in the manufacturing process, the contrast CR of each of the plurality of wire grid polarization elements 1 produced from an identical mother substrate can be 100 or greater.

In the case when the pitch P is from 100 nm to 120 nm, both inclusive:

$$\Delta t/P \leq -0.025 \times P + 16.4$$

In the case when the pitch P is from 120 nm to 140 nm, both inclusive:

$$\Delta t/P \leq 0.025 \times P + 10.4$$

Accordingly, assuming that the difference Δt/P of the thickness t of the residual film 75 is 13.4% or less in a wide range including from 100 nm to 140 nm of the pitch P, the contrast CR of each of the plurality of wire grid polarization elements 1 produced from an identical mother substrate can be 100 or greater. Further, assuming that the difference Δt (nm) of the thickness t of the residual film 75 is (0.14×P−0.3) nm or less in a case when the relationship between the pitch P and the difference Δt of the thickness t of the residual film 75 is approximated to a linear function by the least squares method, the contrast CR of each of the plurality of wire grid polarization elements 1 produced from an identical mother substrate can be 100 or greater.

Further, as illustrated in FIG. 14, assuming that the following conditions are met by controlling and managing the conditions in the manufacturing process, the contrast CR of each of the plurality of wire grid polarization elements 1 produced from an identical mother substrate can be 500 or greater.

In the case when the pitch P is from 100 nm to 120 nm, both inclusive:

$$\Delta t/P \leq 9.71$$

In the case when the pitch P is from 120 nm to 140 nm, both inclusive:

$$\Delta t/P \leq 0.02 \times P + 7.3$$

Accordingly, assuming that the difference Δt/P of the thickness t of the residual film 75 is 9.7% or less in a wide range including from 100 nm to 140 nm of the pitch P, the contrast CR of each of the plurality of wire grid polarization elements 1 produced from an identical mother substrate can be 500 or greater. Further, assuming that the difference Δt (nm) of the thickness t of the residual film 75 is (0.11×P−1.4) nm or less in a case when the relationship between the pitch P and the difference Δt of the thickness t of the residual film 75 is approximated to a linear function by the least squares method, the contrast CR of each of the plurality of wire grid polarization elements 1 produced from an identical mother substrate can be 500 or greater.

Substrate 200 for Manufacturing Wiring Grid Polarization Element

According to the above-described manufacturing method, the resist mask forming step ST2 illustrated in FIG. 4 is performed in the course of manufacturing the wire grid polarization element 1, as a result a substrate 200 for manufacturing wiring grid polarization element is produced. In the substrate 200, the metal film 40, the inorganic material film 60 for hard mask, and the resist mask 7 configured as the plurality of convex portions 71 arranged in parallel to each other are sequentially formed on one surface of the mother substrate 20.

In such a substrate 200 for manufacturing the wire grid polarization element, the wire grid polarization element 1 can be produced when Δt/P (%) is 13.4% or less, where the difference between the minimum value and the maximum value, on the mother substrate 20, of the thickness t (the thickness of the residual film 75) of the resist mask 7 remaining at the bottom portion of the concave portion 72 interposed between the adjacent convex portions 71 is Δt (nm) and the pitch of the convex portion 71 is P (nm).

Further, in the substrate 200 for manufacturing a wire grid polarization element, the wire grid polarization element 1 can be produced, when the pitch P (nm) of the convex portion 71 and the difference Δt meet the following conditional formula: Δt≤(0.14×P−0.3) where the difference between the minimum value and the maximum value, on the mother substrate 20, of the thickness t (the thickness of the residual film 75) of the resist mask 7 remaining at the bottom portion of the concave portion 72 interposed between the adjacent convex portions 71 is Δt (nm).

Method of Measuring Difference Δt of Thickness t of Residual Film 75

Figure 15A:
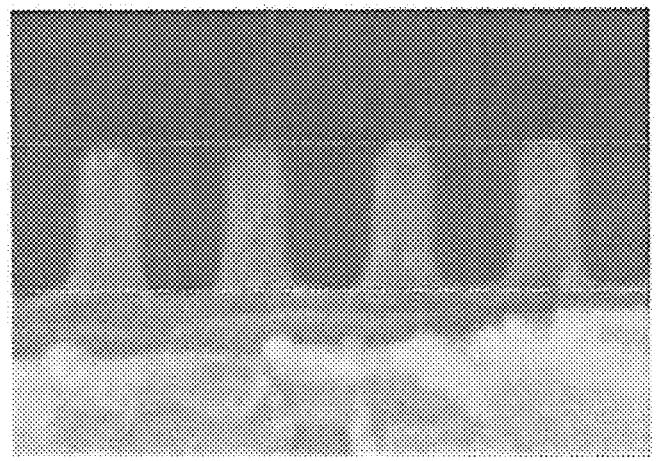
FIGS. 15A and 15B are explanatory views of a method of measuring the thickness of the resist mask.
Figure 15B:
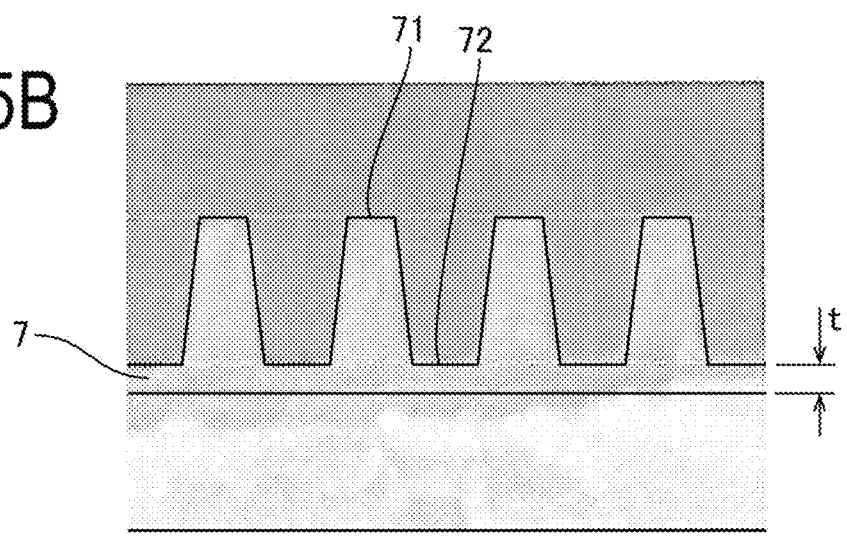

FIGS. 15A and 15B is an explanatory view of a method of measuring the thickness t of the resist mask, and is an explanatory view of an imaging result of a focused ion beam scanning electron microscope. Note that FIG. 15A illustrates the imaging result and FIG. 15B illustrates an explanatory view of the imaging result.

In the method of manufacturing the wire grid polarization element 1 to which the disclosure is applied, the difference Δt (nm) between the maximum value and the minimum value, on the mother substrate 20, of the thickness t (the thickness of the residual film 75) of the resist mask 7 remaining at the bottom portion of the concave portion 72 represents a difference between the maximum value and the minimum value obtained by measuring the thickness t of the resist mask remaining at the bottom portion of the concave portion 72 at the plurality of points in the effective region 20y on the mother substrate 20. In this embodiment, a focused ion beam scanning electron microscope is used for measuring the thickness t.

According to the focused ion beam scanning electron microscope, the cross-section of the resist mask 7 is imaged as illustrated in the imaging result of FIG. 15A. According to the above-described imaging result, as illustrated in the explanatory view of FIG. 15B, the thickness t of the resist mask remaining at the bottom portion of the concave portion 72 can be measured.

First Example of Measurement Points for Measuring Thickness t of Residual Film 75

Figure 16:
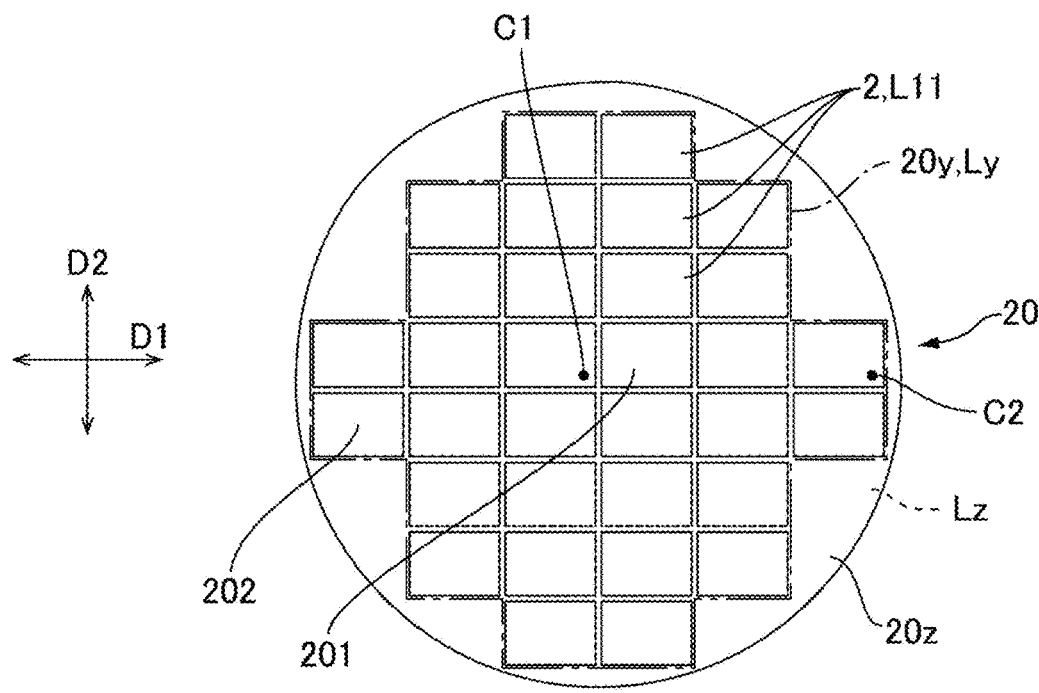
FIG. 16 is an explanatory view of a first example of the measurement points for measuring the thickness of the residual film.

FIG. 16 is an explanatory view of a first example of the measurement points for measuring the thickness t of the residual film 75. In this embodiment as illustrated in FIG. 16, a plurality of points to be measured are designed to at least include a center portion C0 in the effective region 20y and a first end portion C1 of the effective region 20y located apart from the center portion C0 toward one side in the first direction D1 in the in-plane direction of the mother substrate 20, in measuring the thickness t of the resist mask remaining at the bottom portion of the concave portion 72 at the plurality of points in the effective region 20y on the mother substrate 20. According to a nanoimprint method, a variation in the thickness t readily occurs at the center portion C0 and the end portions in the effective region 20y, whereas the variation in the circumferential direction hardly occurs. Accordingly, the variation of the thickness t in the entire of the effective region 20y on the mother substrate 20 can be recognized by measuring the thickness t at least at the center portion C0 and the first end portion C1.

Second Example of Measurement Points for Measuring Thickness t of Residual Film 75

Figure 17:
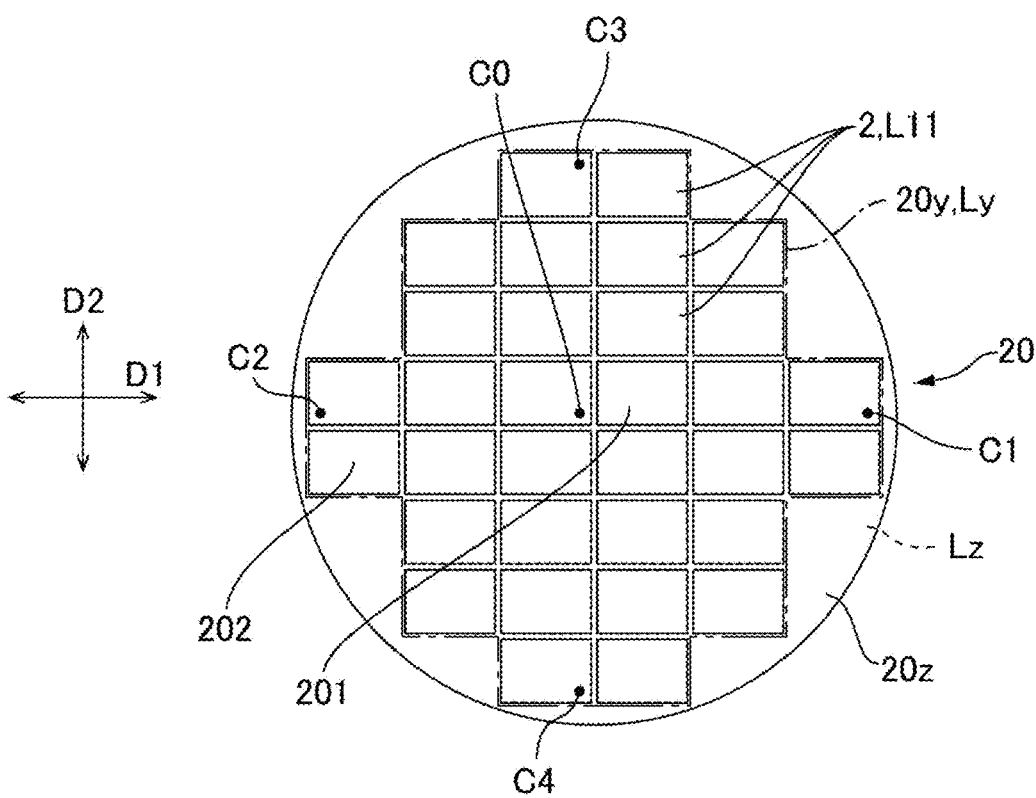
FIG. 17 is an explanatory view of a second example of the measurement points for measuring the thickness t of the residual film.

FIG. 17 is an explanatory view of a second example of the measurement points for measuring the thickness t of the residual film 75. In this embodiment as illustrated in FIG. 17, a plurality of points to be measured are designed to be five points illustrated in FIG. 17 in measuring the thickness t of the resist mask remaining at the bottom portion of the concave portion 72 at the plurality of points in the effective region 20y on the mother substrate 20. Specifically, the plurality of points to be measured at least include: the center portion C0 in the effective region 20y, the first end portion C1 of the effective region 20y located apart from the center portion C0 toward one side in the first direction D1, a second end portion C2 of the effective region 20y located apart from the center portion C0 toward the other side in the first direction D1, a third end portion C3 of the effective region 20y located apart from the center portion C0 toward one side in the second direction D2 orthogonal to the first direction D1 in the in-plane direction of the mother substrate 20, and a fourth end portion C4 of the effective region 20y located apart from the center portion C0 toward the other side in the second direction D2.

According to the above aspect, the variation of the thickness t in the entire of the effective region 20y on the mother substrate 20 can further be suitably recognized even when measurement points are few.

Third Example of Measurement Points for Measuring Thickness t of Residual Film 75

Figure 18:
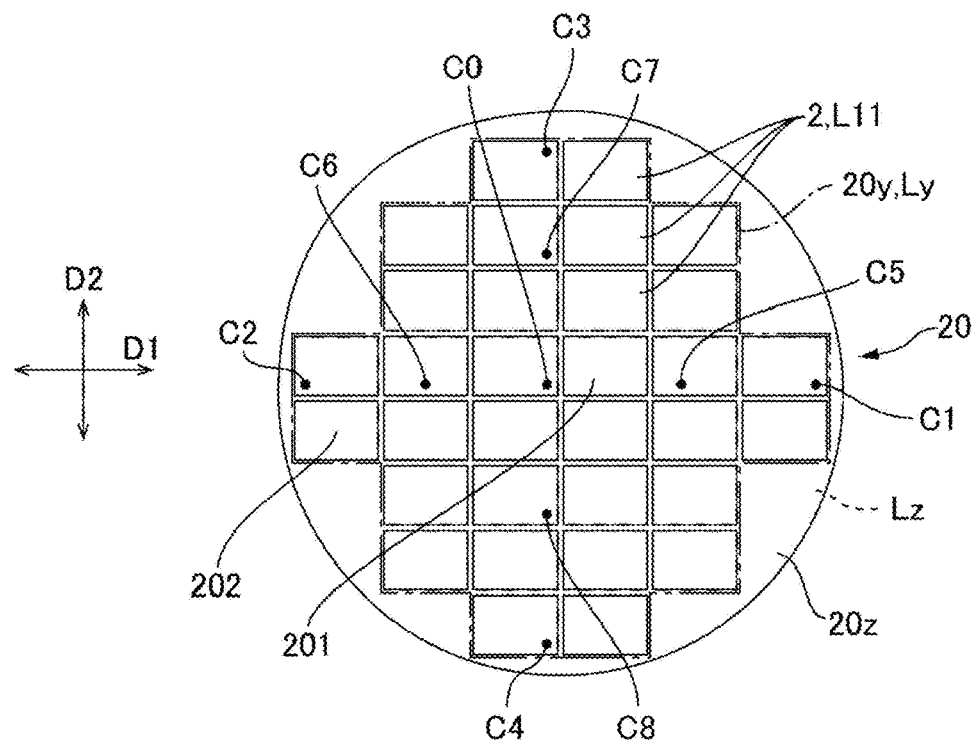
FIG. 18 is an explanatory view of a third example of the measurement points for measuring the thickness of the residual film.

FIG. 18 is an explanatory view of a third example of the measurement points for measuring the thickness t of the residual film 75. In this embodiment as illustrated in FIG. 18, a plurality of points to be measured are designed to be nine points including the center portion C0, the first end portion C1, the second end portion C2, the third end portion C3, and the fourth end portion C4 in measuring the thickness t of the resist mask remaining at the bottom portion of the concave portion 72 at the plurality of points in the effective region 20y on the mother substrate 20. More specifically, the plurality of points to be measured additionally include: a first intermediate position C5 located between the center portion C0 and the first end portion C1 in a manner apart from the center portion C0 and the first end portion C1 by a distance of 1 cm or greater, a second intermediate position C6 located between the center portion C0 and the second end portion C2 in a manner apart from the center portion C0 and the second end portion C2 by a distance of 1 cm or greater, a third intermediate position C7 located between the center portion C0 and the third end portion C3 in a manner apart from the center portion C0 and the third end portion C3 by a distance of 1 cm or greater, a fourth intermediate position C8 located between the center portion C0 and the fourth end portion C4 in a manner apart from the center portion C0 and the fourth end portion C4 by a distance of 1 cm or greater.

According to the above aspect, the variation of the thickness t in the entire of the effective region 20y on the mother substrate 20 can further be suitably recognized.

Fourth Example of Measurement Point for Measuring Thickness t of Residual Film 75

Figure 19:
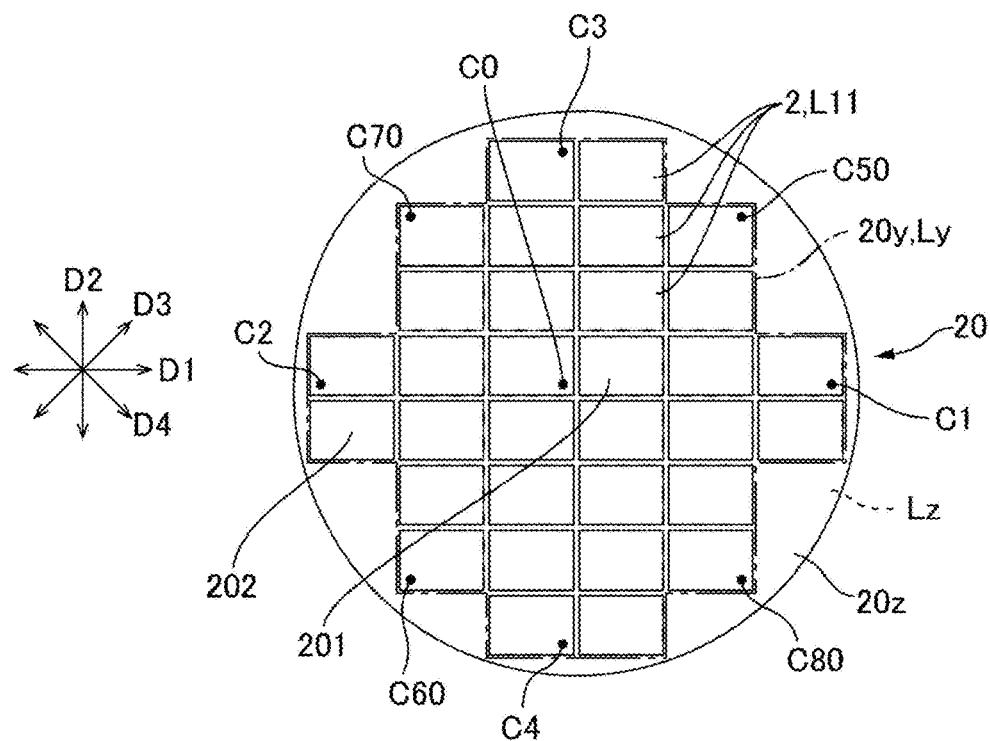
FIG. 19 is an explanatory view of a fourth example of the measurement points for measuring the thickness of the residual film.

FIG. 19 is an explanatory view of a fourth example of the measurement points for measuring the thickness t of the residual film 75. In this embodiment as illustrated in FIG. 19, a plurality of points to be measured are designed to be nine points including the center portion C0, the first end portion C1, the second end portion C2, the third end portion C3, and the fourth end portion C4 in measuring the thickness t of the resist mask remaining at the bottom portion of the concave portion 72 at the plurality of points in the effective region 20y on the mother substrate 20. In this embodiment, a position apart from the center portion C0 in the third direction D3 and in the fourth direction D4 is also included in the measurement points when one of the two directions intersecting the first direction D1 and the second direction D2 in the in-plane direction of the mother substrate 20 is defined as the third direction D3 and the other is defined as the fourth direction D4. More specifically, the plurality of points to be measured additionally include: a fifth end portion C50 of the effective region 20y located apart from the center portion C0 toward one side in the third direction D3, a sixth end portion C60 of the effective region 20y located apart from the center portion C0 toward the other side in the third direction D3, a seventh end portion C70 of the effective region 20y located apart from the center portion C0 toward one side in the fourth direction D4, and an eighth end portion C80 of the effective region 20y located apart from the center portion C0 toward the other side in the fourth direction D4.

According to the above aspect, the variation of the thickness t in the entire of the effective region 20y on the mother substrate 20 can further be suitably recognized.

Fifth Example of Measurement Point for Measuring Thickness t of Residual Film 75

Figure 20:
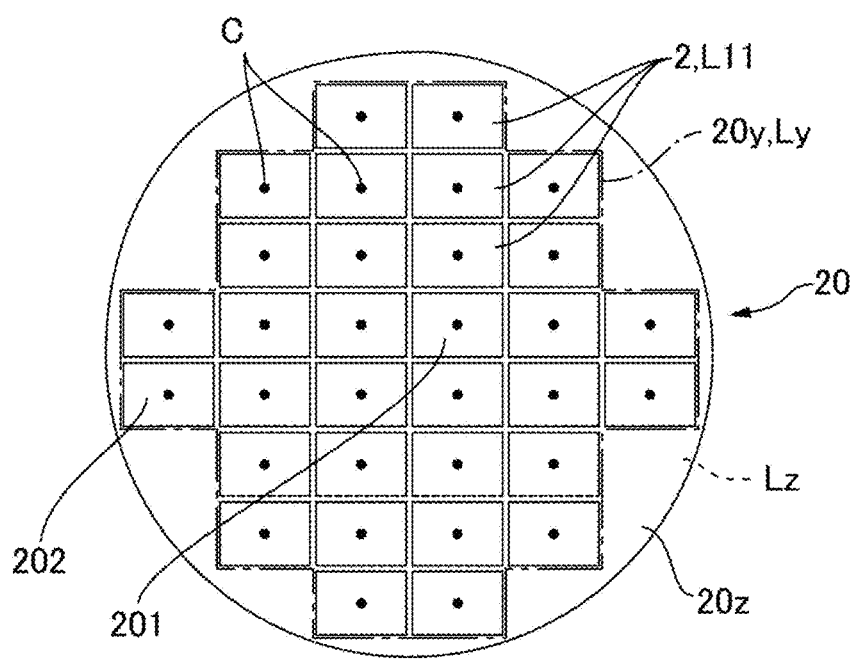
FIG. 20 is an explanatory view of a fifth example of the measurement points for measuring the thickness of the residual film.

FIG. 20 is an explanatory view of a fifth example of the measurement points for measuring the thickness t of the residual film 75. In this embodiment as illustrated in FIG. 20, as a plurality of points for measuring the thickness t of the residual film 75, in the effective region 20y on the mother substrate 20, the thickness t of the resist mask is measured at each of a plurality of regions from which each of the substrates 2 (the wire grid polarization elements 1) is produced. On this occasion, the thickness t of the resist mask is measured at one point C in each region from which each substrate 2 (the wire grid polarization element 1) is produced. According to the above aspect, the variation of the thickness t in the entire of the effective region 20y on the mother substrate 20 can further be suitably recognized, and by which the properties of the wire grid polarization element 1 can be reliably recognized.

Other Exemplary Embodiments

Although in the exemplary embodiments described above, the light absorption layer 51 is provided at the end portion of the wire-shaped metal layer 41, the disclosure may also be applied to the case where the light absorption layer 51 is not provided.

Configuration Example 1 of Projection-Type Display Apparatus

Figure 21:
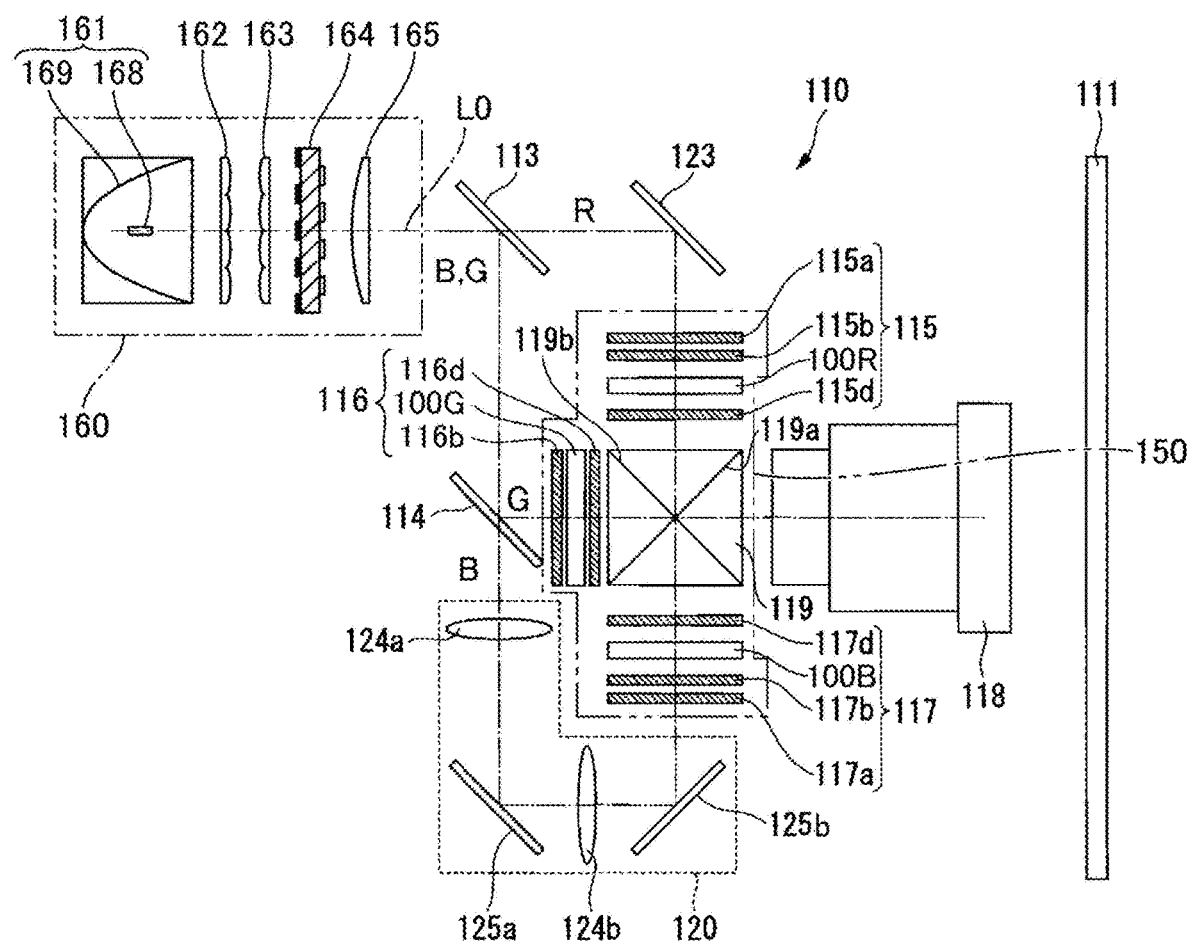
FIG. 21 is an explanatory view of a projection-type display apparatus using a transmission type liquid crystal panel.

A projection-type display apparatus (liquid crystal projector) using one of the wire grid polarization elements 1 according to the exemplary embodiments described above will now be described. FIG. 21 is an explanatory view of a projection-type display apparatus using a transmission type liquid crystal panel.

Figure 22:
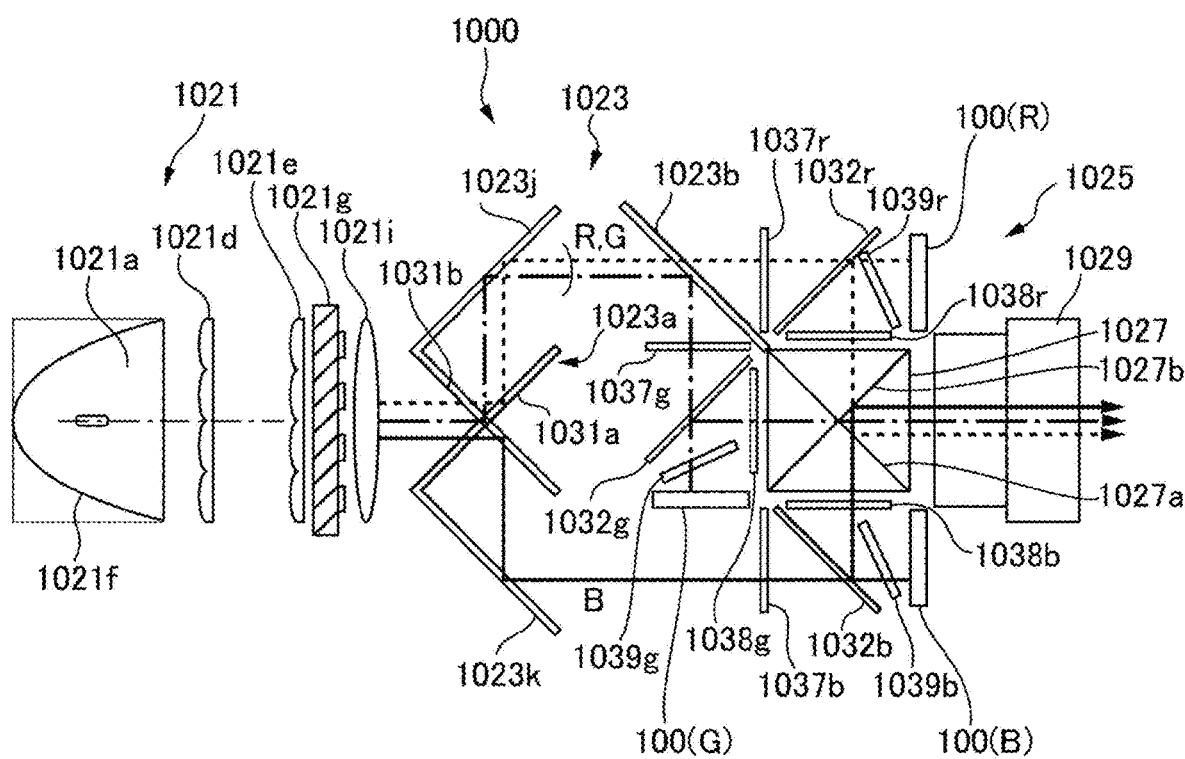
FIG. 22 is an explanatory view of a projection-type display apparatus using a reflection type liquid crystal panel.

Note that, both of a projection-type display apparatus 110 illustrated in FIG. 21 and a projection-type display apparatus 1000 described below with reference to FIG. 22 is provided with a liquid crystal panel, a light source unit configured to emit light to be supplied to the liquid crystal panel, and a projection optical system configured to project light modulated by the liquid crystal panel. One of the wire grid polarization elements 1 described with reference to FIGS. 1 to 20 is arranged on an optical path extending from the light source unit, via the liquid crystal panel, to the projection optical system.

The projection-type display apparatus 110 illustrated in FIG. 21, which is a liquid crystal projector using transmission type liquid crystal panel, irradiates light onto a projected member 111 including a screen and the like to display an image. In the projection-type display apparatus 110 thus configured, the wire grid polarization element 1 to which the disclosure is applied is used for one or the other of first polarization plates 115b, 116b, and 117b and second polarization plates 115d, 116d, and 117d. The polarization plates will be described below.

The projection-type display apparatus 110 includes a lighting unit 160, a plurality of liquid crystal light valves (liquid crystal light valves 115 to 117) configured to receive light from the lighting unit 160, a cross dichroic prism 119 (synthetic optical system) configured to synthesize component lights emitted from the liquid crystal light valves 115 to 117 and emits the synthesized light, and a projection optical system 118 configured to project the light synthesized by the cross dichroic prism 119. These apparatuses or components are arranged along the optical axis L0 of the apparatus. The projection-type display apparatus 110 also includes dichroic mirrors 113 and 114, and a relay system 120. In the projection-type display apparatus 110, the liquid crystal light valves 115 to 117, and the cross dichroic prism 119 constitute an optical unit 150.

The lighting unit 160 includes a light source unit 161, a first integrator lens 162 including a lens array of, for example, fly-eye lenses, and a second integrator lens 163 including a lens array of, for example, fly-eye lenses, a polarization conversion element 164, and a condenser lens 165 that are sequentially arranged along the optical axis L0 of the apparatus. The light source unit 161 includes a light source 168 configured to emit white light including a red component light R, a green component light G, and a blue component light B, and a reflector 169. The light source 168 is configured with an ultrahigh-pressure mercury-vapor lamp or the like, and the reflector 169 includes a parabolic cross section. The first integrator lens 162 and the second integrator lens 163 uniformize the illumination distribution of the light emitted from the light source unit 161. The polarization conversion element 164 polarizes the light coming from the light source unit 161 into a polarized light, such as s-polarized light, having a specific direction of oscillation.

The dichroic mirror 113 transmits the red component light R of white light emitted from the lighting unit 160 and reflects the green component light G and the blue component light B. The dichroic mirror 114 transmits the blue component light B and reflects the green component light G, in the green component light G and the blue component light B reflected from the dichroic mirror 113. As such, the dichroic mirrors 113 and 114 constitute a color separation optical system for separating the light emitted from the lighting unit 160 into the red component light R, the green component light G, and the blue component light B.

The liquid crystal light valve 115, which is a transmission type liquid crystal device, is configured to modulate, in accordance with the image signal, the red component light R transmitted through the dichroic mirror 113 and reflected from a reflection mirror 123. The liquid crystal light valve 115 includes a λ/2 retardation plate 115a, the first polarization plate 115b, a liquid crystal panel 100R, and the second polarization plate 115d. It is herein noted that the red component light R, which is incident on the liquid crystal light valve 115, does not change in polarization after transmitting through the dichroic mirror 113, thus maintains the s-polarized state.

The λ/2 retardation plate 115a is an optical element for converting the s-polarized light incident on the liquid crystal light valve 115 into p-polarized light. The first polarization plate 115b is a polarization plate that blocks s-polarized light and transmits p-polarized light. The red liquid crystal device 100R is configured to convert p-polarized light into s-polarized light (for halftone, circularly polarized light or elliptically polarized light) by modulation in accordance with the image signal. The second polarization plate 115d is a polarization plate that blocks p-polarized light and transmits s-polarized light. Accordingly, the liquid crystal light valve 115 modulates red component light R in accordance with the image signal and emits the red component light R thus modulated toward the cross dichroic prism 119.

A liquid crystal light valve 116 is a liquid crystal device configured to modulate the green component light G reflected from dichroic mirror 113 and further reflected from dichroic mirror 114 in accordance with the image signal. The liquid crystal light valve 116 includes, as in the liquid crystal light valve 115, the first polarization plate 116b, a liquid crystal panel 100G, and the second polarization plate 116d. The green component light G incident on the liquid crystal light valve 116 is s-polarized light reflected from the dichroic mirrors 113 and 114. The first polarization plate 116b is a polarization plate that blocks p-polarized light and transmits s-polarized light. The liquid crystal panel 100G is configured to convert s-polarized light into p-polarized light (for halftone, circularly polarized light or elliptically polarized light) by modulation in accordance with the image signal. The second polarization plate 116d is a polarization plate that blocks s-polarized light and transmits p-polarized light. Accordingly, the liquid crystal light valve 116 modulates green component light G in accordance with the image signal and emits the green component light G thus modulated toward the cross dichroic prism 119.

The liquid crystal light valve 117, which is a liquid crystal device, is configured to modulate the blue component light B, reflected from dichroic mirror 113, transmitted through dichroic mirror 114, and then passed through the relay system 120, in accordance with the image signal. The liquid crystal light valve 117 includes, as in the liquid crystal light valves 115 and 116, a λ/2 retardation plate 117a, the first polarization plate 117b, a liquid crystal panel 100B, and the second polarization plate 117d. The blue component light B incident on the liquid crystal light valve 117, is reflected from dichroic mirror 113, transmitted through dichroic mirror 114, and is then reflected from two reflection mirrors 125a and 125b of the relay system 120, thus being s-polarized light.

The λ/2 retardation plate 117a is an optical element for converting the s-polarized light incident on the liquid crystal light valve 117 into p-polarized light. The first polarization plate 117b is a polarization plate that blocks s-polarized light and transmits p-polarized light. The liquid crystal panel 100B is configured to convert p-polarized light into s-polarized light (for halftone, circularly polarized light or elliptically polarized light) by modulation in accordance with the image signal. The second polarization plate 117d is a polarization plate that blocks p-polarized light and transmits s-polarized light. Accordingly, the liquid crystal light valve 117 modulates blue component light B in accordance with the image signal and emits the blue component light B thus modulated toward the cross dichroic prism 119.

The relay system 120 includes relay lenses 124a and 124b and the reflection mirrors 125a and 125b. The relay lenses 124a and 124b are provided to prevent optical loss due to the long optical path length of the blue component light B. The relay lens 124a is disposed between the dichroic mirror 114 and the reflection mirror 125a. The relay lens 124b is disposed between the reflection mirrors 125a and 125b. The reflection mirror 125a reflects the blue component light B having passed through the dichroic mirror 114 and exiting from the relay lens 124a toward the relay lens 124b. The reflection mirror 125b reflects the blue component light B exiting from the relay lens 124b toward the liquid crystal light valve 117.

The cross dichroic prism 119 is a color synthesizing optical system defined by an X-shaped orthogonal arrangement of two dichroic films 119a and 119b. The dichroic film 119a reflects blue component light B and transmits green component light G, while the dichroic film 119b reflects red component light R and transmits green component light G. Accordingly, the cross dichroic prism 119 synthesizes red component light R, green component light G, and blue component light B, each modulated by the liquid crystal light valves 115, 116, and 117 and emits the light thus synthesized toward the projection optical system 118.

Note that the light incident on the cross dichroic prism 119 from the liquid crystal light valves 115 and 117 is s-polarized light, while the light incident on the cross dichroic prism 119 from the liquid crystal light valve 116 is p-polarized light. Since the cross dichroic prism 119 receives different types of polarized lights, the lights incident from the liquid crystal light valves 115 to 117 can be synthesized together within the cross dichroic prism 119. It is herein noted that the dichroic films including the dichroic films 119a and 119b are normally high reflective of s-polarized light. Due to the above background, the red component light R and blue component light B reflected from the dichroic films 119a and 119b are each made to be s-polarized light, while the green component light G passing through the dichroic films 119a and 119b is made to be p-polarized light. The projection optical system 118, which includes a non-illustrated projection lens, projects light synthesized in the cross dichroic prism 119 onto the projected member 111, such as a screen.

Configuration Example 2 of Projection-Type Display Apparatus

FIG. 22 is an explanatory diagram of a projection-type display apparatus using a reflection type liquid crystal panel. The wire grid polarization element 1 to which the disclosure is applied is used for wire grid polarization plates 1032r, 1032g, and 1032b described below. Alternatively, the wire grid polarization element 1 to which the disclosure is applied may be used for either one or both of incident side polarization plates 1037b, 1037g, and 1037r and exit side polarization plates 1038b, 1038g, and 1038r.

The projection-type display apparatus 1000 illustrated in FIG. 22 includes a light source unit 1021 configured to generate light source light, a color separation light guide optical system 1023 configured to separate the light source light emitted from the light source unit 1021 into three colors of red, green, and blue, and a light modulation unit 1025 configured to receive source light of each color exiting from the color separation light guide optical system 1023. The projection-type display apparatus 1000 also includes a cross dichroic prism 1027 (synthetic optical system) configured to synthesize the image light of each color exiting from the light modulation unit 1025 and a projection optical system 1029 which is a projection optical system configured to project the image light having passed through the cross dichroic prism 1027 onto a non-illustrated screen.

In the projection-type display apparatus 1000 thus configured, the light source unit 1021 includes a light source 1021*a*, a pair of fly eye optical systems 1021*d* and 1021*e*, a polarization conversion member 1021*g*, and a superimposing lens 1021*i*. In this embodiment, the light source unit 1021 including a reflector 1021*f* having a paraboloidal surface emits parallel light. The fly eye optical systems 1021*d* and 1021*e* each include a plurality of element lenses arranged in a matrix pattern in a plane orthogonal to the optical axis of the system, to divide the source light and individually condense and diverge the divided light. The polarization conversion member 1021*g* converts the light source light exiting from the fly eye optical system 1021*e* exclusively into, for example, a p-polarized light component parallel to the drawing sheet surface of FIG. 22 and provides such light to the optical system on the downstream side of the optical path. The superimposing lens 1021*i* appropriately converges, as a whole, the light source light having passed through the polarization conversion member 1021*g*, to thereby enable each of the electro-optical devices 100(R), 100(G), and 100(B) provided in the light modulation unit 1025 to uniformly perform superimposed projection.

The color separation light guide optical system 1023 includes a cross dichroic mirror 1023*a*, a dichroic mirror 1023*b*, and reflection mirrors 1023*j* and 1023*k*. In the color separation light guide optical system 1023, substantially white source light from the light source unit 1021 is incident on the cross dichroic mirror 1023*a*. Red light (R) reflected by a first dichroic mirror 1031*a* included as one of the two components in the cross dichroic mirror 1023*a* is reflected by the reflection mirror 1023*j*, and is then transmitted through the dichroic mirror 1023*b*, to be incident, maintaining the p-polarized state, on the liquid crystal panel 100 (R) for red color (R), through the incident side polarization plate 1037*r*, the wire grid polarization plate 1032*r*, and an optical compensation plate 1039*r*.

Green light (G) reflected by the first dichroic mirror 1031*a* is reflected by the reflection mirror 1023*j*, and further reflected by the dichroic mirror 1023*b*, and is then incident, maintaining the p-polarized state, on the electro-optical device 100(G) for green color (G), through the incident side polarization plate 1037*g*, the wire grid polarization plate 1032*g*, and an optical compensation plate 1039*g*.

On the contrary, blue light (B) reflected by a second dichroic mirror 1031*b* included as another one of the two components in the cross dichroic mirror 1023*a* is reflected by the reflection mirror 1023*k*, and is then incident, maintaining the p-polarized state, on the electro-optical device 100(B) for blue color (B), through the incident side polarization plate 1037*b*, the wire grid polarization plate 1032*b*, and an optical compensation plate 1039*b*. Not that the optical compensation plates 1039*r*, 1039*g*, and 1039*b* each adjust the polarization status of the light incident on and exiting from the electro-optical device 100(B), to thereby optically compensate the properties of the liquid crystal layer.

In the projection-type display device 1000 thus configured, the red, green, and blue lights incident through the optical compensation plates 1039*r*, 1039*g*, and 1039*b* are each modulated in the liquid crystal panels 100 (R), (G) and (B). On this occasion, the s-polarized component of light exiting from the electro-optical devices 100(R), 100(G), and 100(B) are each reflected by the wire grid polarization plates 1032*r*, 1032*g*, and 1032*b*, and are then incident on the cross dichroic prism 1027 through the exit side polarization plates 1038*r*, 1038*g*, and 1038*b*. The cross dichroic prism 1027 includes a first dielectric multilayer film 1027*a* and a second dielectric multilayer film 1027*b* formed as intersecting each other in a cross shape, the former one the first dielectric multilayer film 1027*a* reflects red light (R) and the latter one the second dielectric multilayer film 1027*b* reflects blue light (B). Accordingly, the red, green, and blue lights are synthesized together in the cross dichroic prism 1027, and is then emitted to the projection optical system 1029. Then, the projection optical system 1029 projects the color image light synthesized in the cross dichroic prism 1027, to a non-illustrated screen in a desired magnification.

Other Projection-Type Display Apparatuses

Note that the projection-type display apparatus may be configured such that an LED light source and the like that emits light of colors is used as a light-source unit and the light of colors emitted from the LED light source are each supplied to different liquid-crystal devices for each color of light.

The entire disclosure of Japanese Patent Application No. 2017-247346, filed Dec. 25, 2017 and No. 2018-087917, filed Apr. 30, 2018 are expressly incorporated by reference herein.

What is claimed is:

1. A method of manufacturing a wire grid polarization element including a wire grid configured as a plurality of wire-shaped metal layers arranged in parallel to each other at an equal pitch on one surface of a substrate, the method comprising:

film-forming a metal film and an inorganic material film for hard mask sequentially on one surface of a mother substrate that is larger than the substrate;

forming a resist mask after the film-forming, where a resist layer is coated on one side of the mother substrate, then a mold material for nanoimprinting is pressed against the resist layer to form, in the resist layer, a plurality of convex portions arranged in parallel to each other at a pitch equivalent to a pitch of the plurality of wire-shaped metal layers, and thereafter the resist layer is cured to form the resist mask;

performing dry etching with the resist mask formed, and thus performing a patterning of the metal film to form the plurality of wire-shaped metal layers; and dividing the mother substrate into a plurality of wire grid polarization elements, wherein the forming a resist mask includes leaving the resist mask at a bottom portion of a concave portion interposed between adjacent convex portions of the plurality of convex portions, and $\Delta t/P$ (%) is 13.4% or less where a thickness of the resist mask remaining at the bottom portion of the concave portion is defined as t (nm), a difference between a maximum value and a minimum value of the thickness t is defined as $\Delta t$ (nm), and the pitch is defined as P (nm).

2. The method of manufacturing a wire grid polarization element according to claim 1, wherein a contrast ratio CR, which is a ratio between light transmittances of the wire grid polarization element with respect to two linearly polarized light beams having electric field vibration directions orthogonal to each other, is 100 or greater.

3. The method of manufacturing a wire grid polarization element according to claim 1, wherein
in the film-forming, the metal film, a light absorption film, and the inorganic material film are sequentially formed.

4. The method of manufacturing a wire grid polarization element according to claim 1, wherein
the maximum value of the thickness is at a first position along a direction perpendicular to a direction in which the resist layer is coated on the inorganic material, and
the minimum value of the thickness is at a second, different position along the direction.

5. The method of manufacturing a wire grid polarization element according to claim 1, wherein
the resist mask remaining at the bottom portion of the concave portion is removed during the dry etching.

6. The method of manufacturing a wire grid polarization element according to claim 1, wherein
$\Delta t/P$ (%) is 9.7% or less.

7. The method of manufacturing a wire grid polarization element according to claim 6, wherein
a contrast ratio CR, which is a ratio between light transmittances of the wire grid polarization element with respect to two linearly polarized light beams having electric field vibration directions orthogonal to each other, is 500 or greater.

8. The method of manufacturing a wire grid polarization element according to claim 1, wherein
the difference $\Delta t$ represents a difference between a maximum value and a minimum value obtained by measuring a thickness t of the resist mask remaining at the bottom portion of the concave portion at a plurality of points in an effective region on the mother substrate from which the plurality of substrates are produced.

9. The method of manufacturing a wire grid polarization element according to claim 8, wherein
in the effective region, the thickness t of the resist mask is measured at each of a plurality of regions, from each of which each of the substrates is produced.

10. The method of manufacturing a wire grid polarization element according to claim 8, wherein
a focused ion beam scanning electron microscope is used for measuring the thickness t of the resist mask.

11. The method of manufacturing a wire grid polarization element according to claim 8, wherein
the plurality of points include at least a center portion in the effective region and a first end portion of the effective region located apart from the center portion toward one side in a first direction.

12. The method of manufacturing a wire grid polarization element according to claim 11, wherein
provided that a direction orthogonal to the first direction is defined as a second direction,
the plurality of points at least include:
the center portion,
the first end portion,
a second end portion of the effective region located apart from the center portion toward the other side in the first direction,
a third end portion of the effective region located apart from the center portion toward one side in the second direction, and
a fourth end portion of the effective region located apart from the center portion toward the other side in the second direction.

13. The method of manufacturing a wire grid polarization element according to claim 12, wherein
the plurality of points further include:
a first intermediate position located between the center portion and the first end portion in a manner apart from the center portion and the first end portion by a distance of 1 cm or greater,
a second intermediate position located between the center portion and the second end portion in a manner apart from the center portion and the second end portion by a distance of 1 cm or greater,
a third intermediate position located between the center portion and the third end portion in a manner apart from the center portion and the third end portion by a distance of 1 cm or greater, and
a fourth intermediate position located between the center portion and the fourth end portion in a manner apart from the center portion and the fourth end portion by a distance of 1 cm or greater.

14. The method of manufacturing a wire grid polarization element according to claim 12, wherein
provided that one of two directions intersecting the first direction and the second direction is defined as a third direction and the other is defined as a fourth direction,
the plurality of points further include:
a fifth end portion of the effective region located apart from the center portion toward one side in the third direction,
a sixth end portion of the effective region located apart from the center portion toward the other side in the third direction,
a seventh end portion of the effective region located apart from the center portion toward one side in the fourth direction, and
an eighth end portion of the effective region located apart from the center portion toward the other side in the fourth direction.

15. A method of manufacturing a wire grid polarization element including a wire grid configured as a plurality of wire-shaped metal layers arranged in parallel to each other at an equal pitch on one surface of a substrate,
the method comprising:
film-forming a metal film and an inorganic material film for hard mask sequentially on one surface of a mother substrate that is larger than the substrate;
forming a resist mask after the film-forming, where a resist layer is coated on one side of the mother substrate, then a mold material for nanoimprinting is pressed against the resist layer to form, in the resist layer, a plurality of convex portions arranged in parallel to each other at a pitch equivalent to a pitch of the plurality of wire-shaped metal layers, and thereafter the resist layer is cured to form the resist mask;
performing dry etching with the resist mask formed, and thus performing a patterning of the metal film to form the plurality of wire-shaped metal layers; and
dividing the mother substrate into a plurality of wire grid polarization elements, wherein
the forming a resist mask includes
leaving the resist mask at a bottom portion of a concave portion interposed between adjacent convex portions of the plurality of convex portions, and
a pitch P (nm) and a difference $\Delta t$ meet following conditional formula:

$$\Delta t \leq (0.14 \times P - 0.3)$$

where a thickness of the resist mask remaining at the bottom portion of the concave portion is defined as t (nm), a difference between a maximum value and a minimum value of the thickness t is defined as Δt (nm), and the pitch is defined as P (nm).

16. The method of manufacturing a wire grid polarization element according to claim 15, wherein
a contrast ratio CR, which is a ratio between light transmittances of the wire grid polarization element with respect to two linearly polarized light beams having electric field vibration directions orthogonal to each other, is 100 or greater.

17. The method of manufacturing a wire grid polarization element according to claim 15, wherein
the pitch P (nm) and the difference Δt meet following conditional formula:

$$\Delta t \leq (0.11 \times P - 1.4).$$

18. The method of manufacturing a wire grid polarization element according to claim 17, wherein
a contrast ratio CR, which is a ratio between light transmittances of the wire grid polarization element with respect to two linearly polarized light beams having electric field vibration directions orthogonal to each other, is 500 or greater.

\* \* \* \* \*